(12) United States Patent
Forrest et al.

(10) Patent No.: US 8,017,863 B2
(45) Date of Patent: Sep. 13, 2011

(54) POLYMER WRAPPED CARBON NANOTUBE NEAR-INFRARED PHOTOACTIVE DEVICES

(75) Inventors: Stephen R. Forrest, Ann Arbor, MI (US); Michael S. Arnold, Madison, WI (US); Jeramy D. Zimmerman, Ann Arbor, MI (US); Richard Lunt, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 12/419,846

(22) Filed: Apr. 7, 2009

(65) Prior Publication Data

US 2009/0267060 A1    Oct. 29, 2009

Related U.S. Application Data

(63) Continuation-in-part of application No. 11/263,865, filed on Nov. 2, 2005, now Pat. No. 7,947,897, and a continuation-in-part of application No. 12/351,378, filed on Jan. 9, 2009, now Pat. No. 7,982,130.

(60) Provisional application No. 61/049,594, filed on May 1, 2008, provisional application No. 61/110,220, filed on Oct. 31, 2008.

(51) Int. Cl.
*H01L 31/00* (2006.01)
(52) U.S. Cl. .......................................... 136/263
(58) Field of Classification Search .................. 136/263
See application file for complete search history.

(56) References Cited

U.S. PATENT DOCUMENTS

| 5,201,961 | A | 4/1993 | Yoshikawa et al. |
| 5,350,459 | A | 9/1994 | Suzuki |
| 6,333,458 | B1 | 12/2001 | Forrest et al. |
| 6,352,777 | B1 | 3/2002 | Bulovic et al. |
| 6,420,031 | B1 | 7/2002 | Parthasarathy et al. |
| 6,420,430 | B1 | 7/2002 | Linz et al. |
| 6,440,769 | B2 | 8/2002 | Peumans et al. |
| 6,451,415 | B1 | 9/2002 | Forrest et al. |

(Continued)

FOREIGN PATENT DOCUMENTS

JP    2001267077 A    9/2001

(Continued)

OTHER PUBLICATIONS

A. Star, J.F. Stoddart. D. Steuerman, M. Diehl, A. Boukai, E. W. Wong, X. Yang, S-W. Chung, H. Choi and J.R. Heath, Preparation and properties of polymer wrapped single walled carbon nanotubes, Angew. Chem., 2001, 40, 9, 1721-1725.*

(Continued)

*Primary Examiner* — Alexa D Neckel
*Assistant Examiner* — Miriam Berdichevsky
(74) *Attorney, Agent, or Firm* — Duane Morris LLP

(57) ABSTRACT

A photoactive device includes a photoactive region disposed between and electrically connected to two electrodes where the photoactive region includes a first organic photoactive layer comprising a first donor material and a second organic photoactive layer comprising a first acceptor material. The first donor material contains photoactive polymer-wrapped carbon nanotubes and the photoactive region includes one or more additional organic photoactive material layers disposed between the first donor material layer and the acceptor material layer. The photoactive region creates excitons upon absorption of light in the range of about 400 nm to 1450 nm.

24 Claims, 29 Drawing Sheets

U.S. PATENT DOCUMENTS

| | | | |
|---|---|---|---|
| 6,559,375 | B1 | 5/2003 | Meissner et al. |
| 6,580,027 | B2 | 6/2003 | Forrest et al. |
| 6,657,378 | B2 | 12/2003 | Forrest et al. |
| 7,008,563 | B2 | 3/2006 | Smalley et al. |
| 2003/0042846 | A1 | 3/2003 | Forrest et al. |
| 2003/0127967 | A1 | 7/2003 | Tsutsui et al. |
| 2005/0022856 | A1* | 2/2005 | Komatsu et al. ............... 136/243 |
| 2005/0045867 | A1 | 3/2005 | Ozkan et al. |
| 2005/0110007 | A1 | 5/2005 | Forrest et al. |
| 2005/0189014 | A1 | 9/2005 | Gaudiana et al. |
| 2005/0224113 | A1 | 10/2005 | Xue et al. |
| 2005/0266218 | A1 | 12/2005 | Peumans et al. |
| 2006/0027802 | A1 | 2/2006 | Forrest et al. |
| 2006/0032529 | A1 | 2/2006 | Rand et al. |
| 2006/0118166 | A1* | 6/2006 | Iwaki ............................ 136/263 |
| 2006/0278866 | A1 | 12/2006 | Star |
| 2007/0096085 | A1 | 5/2007 | Rand et al. |
| 2007/0125419 | A1* | 6/2007 | Gui et al. ...................... 136/252 |
| 2007/0193621 | A1 | 8/2007 | Brabec et al. |
| 2008/0018232 | A1 | 1/2008 | Zhang et al. |
| 2008/0149178 | A1 | 6/2008 | Reyes-Reyes et al. |

FOREIGN PATENT DOCUMENTS

| | | |
|---|---|---|
| JP | 2003-347565 A | 12/2003 |
| JP | 2006-270061 A | 5/2006 |
| WO | 03029354 A1 | 4/2003 |
| WO | 2005101524 | 10/2005 |

OTHER PUBLICATIONS

International Search Report and Written Opinion of the ISA/KR for International Application No. PCT/US2009/041797, date of mailing Apr. 1, 2010.

Brian J. Landi, et al, Single-wall Carbon Nanotube-Polymer Solar Cells, Prog. Photovolt: Res. Appl. 2005; 13:165-172.

Adrian Nish, et al, Highly selective dispersion of single-walled carbon nanotubes using aromatic polymers, nature nanotechnology, published online Sep. 16, 2007, vol. 2, Oct. 2007, www.nature.com/naturenanotechnology.

Sergei Lebedkin, et al, Photophysics of carbon nanotubes in organic polymer-toluene dispersions: Emission and excitation satellites and relaxation pathways, publication date Apr. 29, 2008, Physical Review B 77, 165429-1-8 (2008).

Adrian Nish, et al, Direct spectroscopic evidence of energy transfer from photo-excited semiconducting polymers to single-walled carbon nanotubes, publication date Feb. 12, 2008, Nanotechnology 19 (2008) 095603 (6 pp).

Erik Perzon, et al, A Conjugated Polymer for Near Infrared Optoelectronic Applications, Adv. Mater. 2007, 19, 3308-3311.

Steven A. McDonald, et al, Solution-processed PbS quantum dot infrared photodetectors and photovoltaics, nature materials, vol. 4, Feb. 2007, www.nature.com/naturematerials.

Fan Yang, et al, Simultaneous heterojunction organic solar cells with broad spectral sensitivity, published online Feb. 7, 2008, Applied Physics Letters, 92, 053310-1-3 (2008).

Phadeon Avouris, et al, Carbon-nanotube photonics and optoelectronics, pp. 341-350, nature photonics, vol. 2, Jun. 2008, www.nature.com/naturephotonics.

R. Bruce Weisman and Sergie M. Bachilo, Dependence of Optical Transition Energies on Structure for Single-Walled Carbon Nanotubes in Aqueous Suspension: An Empirical Kataura Plat, Nano Letters, 2003, vol. 3, No. 9, 1235-1238.

Mikhail E. Itkis, et al, Bolometric Infrared Photoresponse of Suspended Single-Walled Carbon Nanotube Films, Apr. 21, 2006, Science 312, 413-416 (2006).

S. Kazaoui, et al, Near-infrared photoconductive and photovoltaic devices using single-wall carbon nanotubes in conductive polymer films, published online Oct. 26, 2005, Journal of Applied Physics 98, 084314 (2005).

Yan Yao, et al, Plastic Near-Infrared Photodetectors Utilizing Low Band Gap Polymer, published online Oct. 26, 2007, Adv. Mater., 2007, 19, 3979-3983.

Yosuke Kanai and Jeffrey C. Grossman, Role of Semiconducting and Metallic Tubes in P3HT/Carbon-Nanotube Photovoltaic Heterojunctions: Density Functional Theory Calculations, publication date Feb. 22, 2008, Nano Letters, 8 (3), 908-012, American Chemical Society, Washington, DC.

Emmanuel Kymakis and Gehan A.J. Amaratunga, Carbon Nanotubes as Electron Acceptors in Polymeric Photovoltaics, Apr. 27, 2005, Rev.Adv.Mater.Sci. 10(2005) 300-305.

Vito Sgobba, et al, Supromolecular Assemblies of Different Carbon Nanotubes for Photoconversion Processes, Adv. Mater. 2006, 18, 2264-2269.

Taku Hasobe, et al, Organized Assemblies of Single Wall Carbon Nanotubes and Porphyrin for Photochemical Solar Cells: Charge Injection from Excited Porphyrin into Single-Walled Carbon Nanotubes, Aug. 24, 2006, J. Phys. Chem B, 2006, 110 (50), 25477-26484.

Aslett, Joanne, "Carbon nanotubes to improve solar cells", EE Times.com, Jan. 16, 2002, pp. 1-4.

International Search Report of the ISA/KR for International Application No. PCT/US2009/041816 date of mailing Apr. 21, 2010.

Office Action for U.S. Appl. Application No. 11/566,134 dated Mar. 10, 2011.

International Search Report for International Application No. PCT/US2007/024651, filed on Nov. 29, 2007, date of mailing Feb. 22, 2008.

Written Opinion of the International Searching Authority for International Application No. PCT/US2007/024651, filed on Nov. 29, 2007, date of mailing Feb. 22, 2008.

S. Uchida, J. Xue, B. Rand and S. Forrest, "Organic small molecule solar cells with homogeneously mixed copper phthalocyanine: C60 active layer", May 24, 2004, Applied Physics Letters, 84(21), pp. 4218-4220.

Suemori et al., "Organic solar cells protected by very thick naphthalene tetracarboxylic anhydride films," Appl. Phys. Lett. 85(25): pp. 6269-6271, 2004.

Maennig et al., "Organic p-i-n. solar cells," Appl. Phys. A: Materials Science & Processing 79: pp. 1-14, 2004.

Peumans et al., "Small molecular weight organic thin-film photodetectors and solar cells," Appl. Phys. Rev. 93(7): pp. 3693.

International Search Report, PCT Application No. PCT/US2006/041990 filed Oct. 26, 2006.

Peumans et al., "Efficient photon harvesting at high optical intensities in ultrathin organic double-heterostructure photovoltaic diodes," Appl. Phys. Letts. 76: 2650-52, 2000.

Forrest, "The path to ubiquitous and low-cost organic electronic appliances on plastic," Nature 428: 911-918, 2004.

Forrest, "The limits to organic photovoltaic cell efficiency", Mrs Bulletin 30(1): 28-32, 2005.

Xue et al., "Asymmetric tandem organic photovoltaic cells with hybrid planar-mixed molecular heterojunctions," App;. Phys. Letts. 85(23): 5757-5759, 2004.

Wang et al., "Infrared photocurrent spectral response from plastic solar cell with low-band-gap polyfluorene and fullerene derivative", Appl. Phys. Letts 85(21); 5081-5083, 2004.

Xue et al., "4.2% efficient organic photovoltaic cells with low series resistances", Appl. Phys. Letts. 84(16): 3013-3015, 2004.

Xue et al., "Carrier transport in multilayer organic photodetectors: II. Effects of anode preparation", J. Appl. Phys. 95 (4): 1869-1877, 2004.

Pettersson et al., "Modeling photocurrent action spectra of photovoltaic devices based on organic thin films", J. Appl. Phys. 86(1): 487-496, 1999.

Friedel et al., "A new metal (II) phthalocyanine structure: X-ray and Mossbauer studies of the triclinic tin (II) phthalocyanine", Chemical Communications, 400-401, 1970.

Kubiak et al., "X-ray analysis of phthalocyanines formed in the reaction of Au-Cu and Au-Sn alloys with 1,2-dicyanobenzene", J. Alloys and Compounds 189: 107-111, 1992.

Walzer et al., "STM and STS investigation of ultrathin tin phthalocyanine layers adsorbed on HOPG(0001) and Au (111)", Surf. Sci. 471: 1-10, 2001.

Chen et al., Investigation on structure, spectrum and linear dichroism of SnPc polycrystalline films, Acta Phys. Sin. 45 (1): 146-152, 1996.

Pope et al., "Electronic processes in organic crystals and polymers" (2nd Edition), Oxford University Press, New York, 1999 (abstract included only).

Rand et al., "Mixed donor-acceptor molecular heterojunctions for photovoltaic applications. I. material properties", J. Appl. Phys. 98: 124902-1 to 124902-7 (2005).

Brown et al., "Crystal structure of β-copper phthalocyanine", J. Chem. Soc. A, 2488-2493 (1968).

Rand et al., "Long-range absorption enhancement in organic tandem thin-film solar cells containing silver nanoclusters", J. Appl. Phys. 96(12); 7519-7526, 2004.

* cited by examiner

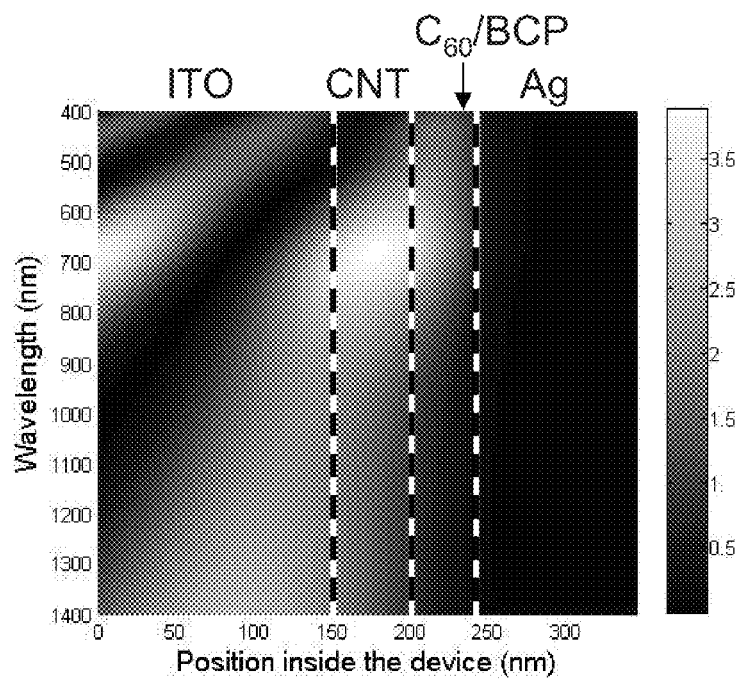
FIG. 12A (35 nm $C_{60}$)
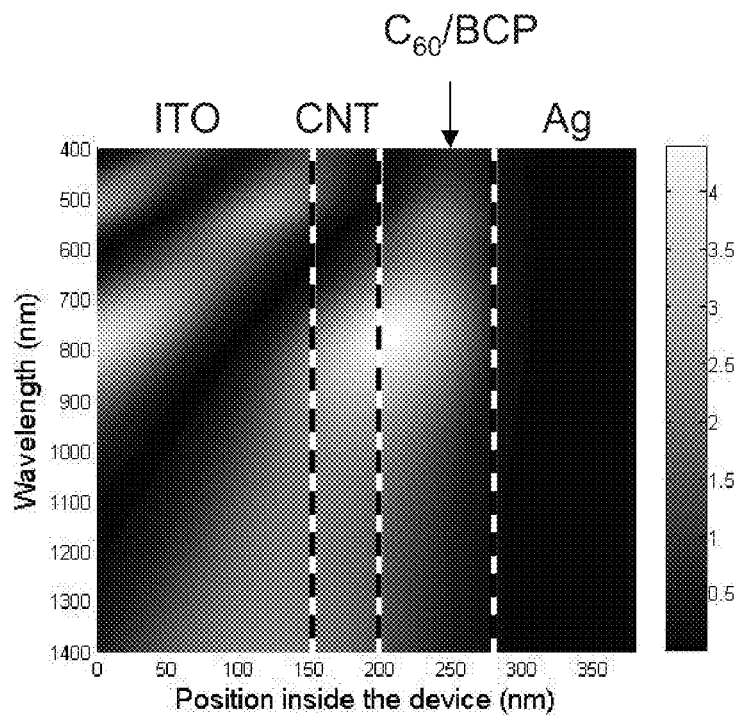
FIG. 12B (70 nm $C_{60}$)

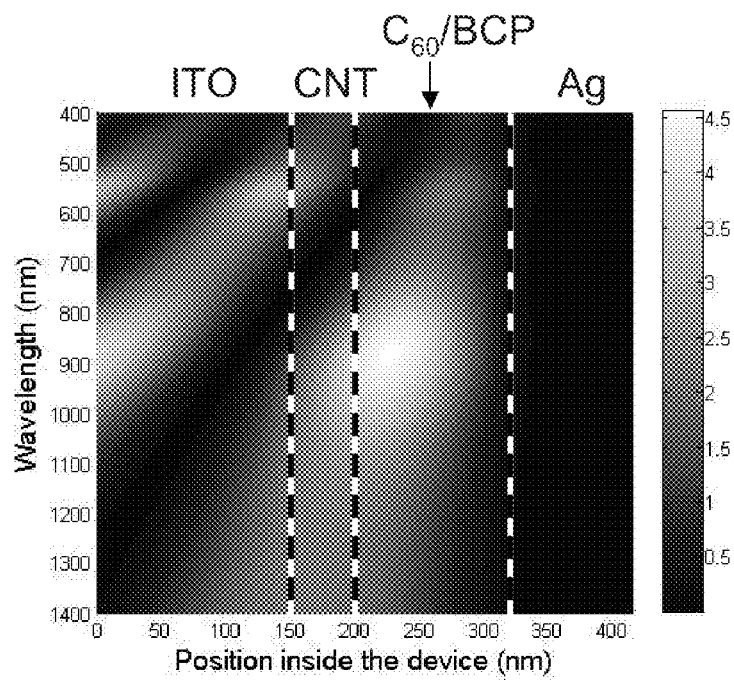
FIG. 12C (105 nm $C_{60}$)
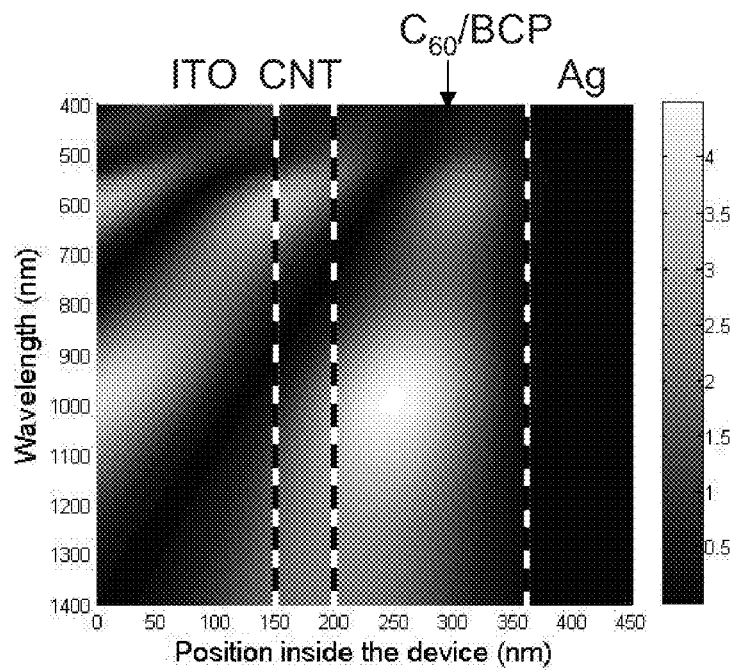
FIG. 12D (140 nm $C_{60}$)

Yang, Lunt, and Forrest, Appl. Phys. Lett. 92, 053310 (2008)

POLYMER WRAPPED CARBON NANOTUBE NEAR-INFRARED PHOTOACTIVE DEVICES

CROSS-REFERENCE TO RELATED APPLICATION

This application claims the benefit under 35 U.S.C. §119 (e) of U.S. Provisional Application Ser. No. 61/049,594, filed May 1, 2008 and U.S. Provisional Application Ser. No. 61/110,220, filed Oct. 31, 2008, the disclosures of which are incorporated herein by reference in their entirety. This application is a continuation-in-part application of U.S. Utility patent application Ser. No. 11/263,865, filed Nov. 2, 2005 now U.S. Pat. No. 7,947,897 and U.S. Utility patent application Ser. No. 12/351,378, filed Jan. 9, 2009 now U.S. Pat. No. 7,982,130, the disclosures of which are incorporated herein by reference in their entirety.

GOVERNMENT RIGHTS

This invention was made with Government support from the United States Army Night Vision and Electronic Sensors Directorate contract No. DAAB07-01-D-G602. The United States Government has certain rights to this invention.

FIELD OF THE INVENTION

The present disclosure is related to the field of organic semiconductors, carbon nanotubes, and photoactive devices.

BACKGROUND

Optoelectronic devices rely on the optical and electronic properties of materials to either produce or detect electromagnetic radiation electronically or to generate electricity from ambient electromagnetic radiation.

Photosensitive optoelectronic devices convert electromagnetic radiation into an electrical signal or electricity. Solar cells, also called photovoltaic ("PV") devices, are a type of photosensitive optoelectronic devices that are specifically used to generate electrical power. Photoconductor cells are a type of photosensitive optoelectronic device that are used in conjunction with signal detection circuitry which monitors the resistance of the device to detect changes due to absorbed light. Photodetectors, which may receive an applied bias voltage, are a type of photosensitive optoelectronic device that are used in conjunction with current detecting circuits which measures the current generated when the photodetector is exposed to electromagnetic radiation.

These three classes of photosensitive optoelectronic devices maybe distinguished according to whether a rectifying junction as defined below is present and also according to whether the device is operated with an external applied voltage, also known as a bias or bias voltage. A photoconductor cell does not have a rectifying junction and is normally operated with a bias. A PV device has at least one rectifying junction and is operated with no bias. A photodetector may have a rectifying junction and is usually but not always operated with a bias.

When electromagnetic radiation of an appropriate energy is incident upon an organic semiconductor material, a photon can be absorbed to produce an excited molecular state. In organic photoconductive materials, the excited molecular state is generally believed to be an "exciton," i.e., an electron-hole pair in a bound state which is transported as a quasi-particle. An exciton can have an appreciable life-time before geminate recombination ("quenching"), which refers to the original electron and hole recombining with each other (as opposed to recombination with holes or electrons from other pairs). To produce a photocurrent, the electron-hole forming the exciton is typically separated at a rectifying junction.

In the case of photosensitive devices, the rectifying junction is referred to as a photovoltaic heterojunction. Types of organic photovoltaic heterojunctions include a donor-acceptor heterojunction formed at an interface of a donor material and an acceptor material, and a Schottky-barrier heterojunction formed at the interface of a photoconductive material and a metal.

In the context of organic materials, the terms "donor" and "acceptor" refer to the relative positions of the Highest Occupied Molecular Orbital ("HOMO") and Lowest Unoccupied Molecular Orbital ("LUMO") energy levels of two contacting but different organic materials. If the HOMO and LUMO energy levels of one material in contact with another are lower, then that material is an acceptor. If the HOMO and LUMO energy levels of one material in contact with another are higher, then that material is a donor. It is energetically favorable, in the absence of an external bias, for electrons at a donor-acceptor junction to move into the acceptor material.

As used herein, a first HOMO or LUMO energy level is "greater than" or "higher than" a second HOMO or LUMO energy level if the first energy level is closer to the vacuum energy level. A higher HOMO energy level corresponds to an ionization potential ("IP") having a smaller absolute energy relative to a vacuum level. Similarly, a higher LUMO energy level corresponds to an electron affinity ("EA") having a smaller absolute energy relative to vacuum level. On a conventional energy level diagram, with the vacuum level at the top, the LUMO energy level of a material is higher than the HOMO energy level of the same material.

After absorption of a photon in the material creates an exciton, the exciton dissociates at the rectifying interface. A donor material will transport the hole, and an acceptor material will transport the electron.

A significant property in organic semiconductors is carrier mobility. Mobility measures the ease with which a charge carrier can move through a conducting material in response to an electric field. In the context of organic photosensitive devices, a material that conducts preferentially by electrons due to high electron mobility may be referred to as an electron transport material. A material that conducts preferentially by holes due to a high hole mobility may be referred to as a hole transport material. A layer that conducts preferentially by electrons, due to mobility and/or position in the device, may be referred to as an electron transport layer ("ETL"). A layer that conducts preferentially by holes, due to mobility and/or position in the device, may be referred to as a hole transport layer ("HTL"). Preferably, but not necessarily, an acceptor material is an electron transport material and a donor material is a hole transport material.

How to pair two organic photoconductive materials to serve as a donor and an acceptor in a photovoltaic heterojunction based upon carrier mobilities and relative HOMO and LUMO levels is well known in the art, and is not addressed here.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substitute does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule." In general, a small molecule has a defined chemical formula with a molecular weight that is the same from molecule to molecule, whereas a polymer has a defined chemical formula with a molecular weight that may vary from molecule to molecule. As used herein, "organic" includes metal complexes of hydrocarbyl and heteroatom-substituted hydrocarbyl ligands.

An organic photosensitive device comprises at least one photoactive region in which light is absorbed to form an exciton, which may subsequently dissociate into an electron and a hole. The photoactive region will typically comprise a donor-acceptor heterojunction, and is a portion of a photosensitive device that absorbs electromagnetic radiation to generate excitons that may dissociate in order to generate an electrical current.

Organic photosensitive devices may incorporate exciton blocking layers (EBLs). EBLs are described in U.S. Pat. No. 6,451,415 to Forrest et al., which is incorporated herein by reference for its disclosure related to EBLs. EBLs (among other things) reduce quenching by preventing excitons from migrating out of the donor and/or acceptor materials. It is generally believed that the EBLs derive their exciton blocking property from having a LUMO-HOMO energy gap substantially larger than that of the adjacent organic semiconductor from which excitons are being blocked. Thus, the confined excitons are prohibited from existing in the EBL due to energy considerations. While it is desirable for the EBL to block excitons, it is not desirable for the EBL to block all charge. However, due to the nature of the adjacent energy levels, an EBL may block one sign of charge carrier. By design, an EBL will exist between two other layers, usually an organic photosensitive semiconductor layer and an electrode or a charge transfer layer. The adjacent electrode or charge transfer layer will be in context either a cathode or an anode. Therefore, the material for an EBL in a given position in a device will be chosen so that the desired sign of carrier will not be impeded in its transport to the electrode or charge transfer layer. Proper energy level alignment ensures that no barrier to charge transport exists, preventing an increase in series resistance.

It should be appreciated that the exciton blocking nature of a material is not an intrinsic property of its HOMO-LUMO energy gap. Whether a given material will act as an exciton blocker depends upon the relative HOMO and LUMO energy levels of the adjacent organic photosensitive material, as well upon the carrier mobility and carrier conductivity of the material. Therefore, it is not possible to identify a class of compounds in isolation as exciton blockers without regard to the device context in which they may be used. However, one of ordinary skill in the art may identify whether a given material will function as an exciton blocking layer when used with a selected set of materials to construct an organic PV device. Additional background explanation of EBLs can be found in U.S. patent application Ser. No. 11/810,782 of Barry P. Rand et al., published as 2008/0001144 A1 on Jan. 3, 2008, the disclosure of which is incorporated herein by reference, and Peumans et al., "Efficient photon harvesting at high optical intensities in ultrathin organic double-heterostructure photovoltaic diodes," Applied Physics Letters 76, 2650-52 (2000).

The terms "electrode" and "contact" are used interchangeably herein to refer to a layer that provides a medium for delivering photo-generated current to an external circuit or providing a bias current or voltage to the device. Electrodes may be composed of metals or "metal substitutes." Herein the term "metal" is used to embrace both materials composed of an elementally pure metal, and also metal alloys which are materials composed of two or more elementally pure metals. The term "metal substitute" refers to a material that is not a metal within the normal definition, but which has the metal-like properties such as conductivity, such as doped wide-bandgap semiconductors, degenerate semiconductors, conducting oxides, and conducting polymers. Electrodes may comprise a single layer or multiple layers (a "compound" electrode), may be transparent, semi-transparent, or opaque. Examples of electrodes and electrode materials include those disclosed in U.S. Pat. No. 6,352,777 to Bulovic et al., and U.S. Pat. No. 6,420,031, to Parthasarathy, et al., each incorporated herein by reference for disclosure of these respective features. As used herein, a layer is said to be "transparent" if it transmits at least 50% of the ambient electromagnetic radiation in a relevant wavelength.

The functional components of organic photosensitive devices are usually very thin and mechanically weak, and therefore the devices are typically assembled on the surface of a substrate. The substrate may be any suitable substrate that provides desired structural properties. The substrate may be flexible or rigid, planar or non-planar. The substrate may be transparent, translucent or opaque. Rigid plastics and glass are examples of preferred rigid substrate materials. Flexible plastics and metal foils are examples of preferred flexible substrate materials.

Organic donor and acceptor materials for use in the photoactive region may include organometallic compounds, including cyclometallated organometallic compounds. The term "organometallic" as used herein is as generally understood by one of ordinary skill in the art and as given, for example, in Chapter 13 of "Inorganic Chemistry" (2nd Edition) by Gary L. Miessler and Donald A. Tarr, Prentice Hall (1999).

Organic layers may be fabricated using vacuum deposition, spin coating, organic vapor-phase deposition, organic vapor jet deposition, inkjet printing and other methods known in the art.

The photoactive region may be part of a Schottky-barrier heterojunction, in which a photoconductive layer forms a Schottky contact with a metal layer. If the photoconductive layer is an ETL, a high work function metal such as gold may be used, whereas if the photoconductive layer is an HTL, a low work function metal such as aluminum, magnesium, or indium may be used. In a Schottky-barrier cell, a built-in electric field associated with the Schottky barrier pulls the electron and hole in an exciton apart. Generally, this field-assisted exciton dissociation is not as efficient as the dissociation at a donor-acceptor interface.

The devices may be connected to a resistive load which consumes or stores power. If the device is a photodetector, the device is connected to a current-detecting circuit which measures the current generated when the photodetector is exposed to light, and which may apply a bias to the device (as described for example in Published U.S. Patent Application 2005-0110007 A1, published May 26, 2005 to Forrest et al.). If the rectifying junction is eliminated from the device (e.g., using a single photoconductive material as the photoactive region), the resulting structure may be used as a photoconductor cell, in which case the device is connected to a signal detection circuit to monitor changes in resistance across the device due to the absorption of light. Unless otherwise stated, each of these arrangements and modifications may be used for the devices in each of the drawings and embodiments disclosed herein.

An organic photosensitive optoelectronic device may also comprise transparent charge transfer layers, electrodes, or charge recombination zones. A charge transfer layer may be organic or inorganic, and may or may not be photoconductively active. A charge transfer layer is similar to an electrode, but does not have an electrical connection external to the device and only delivers charge carriers from one subsection of an optoelectronic device to the adjacent subsection. A charge recombination zone is similar to a charge transfer layer, but allows for the recombination of electrons and holes between adjacent subsections of an optoelectronic device. A charge recombination zone may include semi-transparent metal or metal substitute recombination centers comprising nanoclusters, nanoparticles, and/or nanorods, as described for example in U.S. Pat. No. 6,657,378 to Forrest et al.; Published U.S. Patent Application 2006-0032529 A1, entitled "Organic Photosensitive Devices" by Rand et al., published Feb. 16, 2006; and Published U.S. Patent Application 2006-0027802 A1, entitled "Stacked Organic Photosensitive Devices" by Forrest et al., published Feb. 9, 2006; each incorporated herein by reference for its disclosure of recombination zone materials and structures. A charge recombination zone may or may not include a transparent matrix layer in which the recombination centers are embedded. A charge transfer layer, electrode, or charge recombination zone may serve as a cathode and/or an anode of subsections of the optoelectronic device. An electrode or charge transfer layer may serve as a Schottky contact.

For additional background explanation and description of the state of the art for organic photosensitive devices, including their general construction, characteristics, materials, and features, U.S. Pat. Nos. 6,972,431, 6,657,378 and 6,580,027 to Forrest et al., and U.S. Pat. No. 6,352,777 to Bulovic et al., are incorporated herein by reference in their entireties.

The discovery in 1992 of photoinduced charge transfer between conjugated polymers and fullerenes (N. S. Sariciftci et al., Proc. SPLE, 1852:297-307 (1993)) has inspired a great deal of research into the possible use of fullerenes in photovoltaic and photodetector devices. This led to the fabrication of several photovoltaic systems that employ a combination of polymer and fullerenes. It has been found that fullerenes can be susceptible to photooxidation. The observation of photo-induced electron transfer at a multi-wall carbon nanotube-conjugated polymer interface (H. Ago et al., Phys. Rev. B, 61:2286 (2000)) has inspired attempts to use carbon nanotubes (CNTs) and in particular single-walled carbon nanotubes (SWNTs) as electron acceptor materials in photovoltaic devices.

The first reported use of CNTs as electron acceptors in a bulk-heterojunction photovoltaic cell was a blend of SWNTs with polythiophenes, in which an increase in photocurrent of two orders of magnitude was observed (E. Kymakis, G. A. J. Amaratunga, Appl. Phys. Lett. 80:112 (2002)). In 2005, a photovoltaic effect was observed in an isolated SWNT illuminated with 1.5 µm (0.8 eV) radiation (J. U. Li, Appl. Phys. Lett. 87:073101 (2005)).

Kymakis (E. Kymakis and G. Amaratunga, Rev. Adv. Mat. Sci. 10:300-305 (2005) has described the use of carbon nanotubes as electron acceptors in a polymeric photovoltaic system based on poly (3-octylthiophene). In this system, the nanotubes serve as electron acceptors and electron conductors; the photocurrent declines at CNT concentrations greater than about 1%, and the authors concluded that the nanotubes do not contribute to the photocurrent.

Ajayan et al., (U.S. Patent Application Publication No. 2006/0272701) have described the use of SWNTs as the electron-transporting component in a photovoltaic device, using covalently attached organic dyes as the photo-responsive component. More recently, Mitra et al., have similarly employed SWNTs as the electron-transporting component in a photovoltaic device based on $C_{60}$-organic semiconductor heterojunctions (C. Li. et al., J. Mater. Chem. 17, 2406 (2007); C. Li and S. Mitra, Appl. Phys. Lett. 91, 253112 (2007)). These devices employ SWNTs as electron-accepting and electron-conducting elements. Previous workers have noted that the metallic SWNTs in these devices provide short-circuit pathways for the recombination of holes and electrons, and have speculated that the devices would be more efficient if isolated semiconducting SWNTs were employed (E. Kymakis et al., J. Phys. D: Appl. Phys. 39, 1058-1062 (2006); M. Vignali et al., http://re.jrc.cec.eu.int/solarec/publications/paris_polymer.pdf (undated)). However, the use of semiconducting SWNTs in such designs employ the SWNTs as electron-accepting and electron-conducting elements only, rather than as sources of photogenerated excitons. The existing and proposed devices do not take advantage of the photoelectric (i.e. photoconducting or photovoltaic) properties of semiconducting SWNTs.

Currently, all synthetic methods for growing SWNTs result in heterogeneous mixtures of SWNTs that vary in their structural parameters (length, diameter, and chiral angle), and consequently have variations in their electronic and optical properties (e.g., conductivity, electrical band gap, and optical band gap) (M. S. Arnold, A. A. Green, J. F. Hulvat et al., Nature Nanotech. 1(1), 60 (2006); M. S. Arnold, S. I. Stupp, and M. C. Hersam, Nano Letters 5 (4), 713 (2005); R. H. Baughman, A. A. Zakhidov, and W. A. de Heer, Science 297 (5582), 787 (2002). All reported CNT-based photovoltaic devices reported to date employ these mixtures.

Recent advances include fabrication methods for CNT thin films on various substrates such as (polyethylene terephthalate (PET), glass, polymethylmethacrylate) (PMMA), and silicon (Y. Zhou, L. Hu, G. Griiner, Appl. Phys. Lett. 88:123109 (2006)). The method combines vacuum filtration generation of CNT mats with a transfer-printing technique, and allows controlled deposition and patterning of large area, highly conducting CNT films with high homogeneity. Such films are a potential alternative to the commonly-used hole-collecting electrode material, indium-tin oxide (ITO), which is expensive and remains incompatible with roll-to-roll fabrication processing.

The properties of carbon nanotubes are influenced mostly by the diameter of the tube and the degree of twist. Both aligned tubes and tubes with a twist can be metallic or semiconducting, depending on whether the energy states in the circumferential direction pass through what is termed a Fermi point. At Fermi points, the valence and conduction bands meet, which allows for conduction in the circumferential direction of the tube. Tubes that have the correct combination of diameter and chirality will possess a set of Fermi points around the perimeter of their grid structures throughout the length of the tube. These tubes will show metallic like conduction. If the diameter and chirality do not generate a set of Fermi points, the tube will exhibit semiconducting behavior (P. Avouris, Chemical Physics, 281: 429-445 (2002)).

In addition to Fermi point matchups, the cylindrical shape and diameter of the tube affects electron transport through the way in which quantum states exist around the tube perimeter. Small diameter tubes will have a high circumferential band gap with a low number of energy states available. As the tube diameter increases, the number of energy states increases and the circumferential band gap decreases. In general, the band gap is inversely proportional to the tube diameter.

Furthermore, the wave properties of electrons are such that standing waves can be set up radially around a carbon nanotube. These standing waves, the lack of conduction states in small diameter tubes, and the monolayer thickness of the graphite sheet, combine to inhibit electron motion around the tube perimeter and force electrons to be transported along the tube axis.

If a Fermi point matchup is present, however, electron transport can occur around the tube perimeter, in addition to axial conduction, allowing for increased transport options of the electron and metallic conduction characteristics. As the tube diameter increases, more energy states are allowed around the tube perimeter and this also tends to lower the band gap. Thus, when only axial conduction is allowed, the tube exhibits semiconducting behavior. When both axial and circumferential conduction are allowed, the tube exhibits metallic conduction.

The power output of existing organic photovoltaic devices is not yet competitive with traditional silicon-based photovoltaic devices. In addition to being less efficient and like other thin-film approaches, they are susceptible to oxidative degradation when exposed to air, and need encapsulation. Given the cost and fragility of silicon solar cells, and the promise of easily-fabricated and inexpensive organic equivalents, there remains a need for more efficient and more stable organic photovoltaic and photodetecting devices. Also, because of organic materials' poor sensitivity to IR and near-IR radiation, there remains a need for organic photovoltaic materials capable of efficiently producing excitons upon irradiation by IR and NIR radiation.

Semiconducting CNTs, despite their strong near-IR band gap absorption, have only had limited impact as the optically absorptive components of optoelectronic devices because of the strong binding energy of photogenerated electron-hole pairs.

SUMMARY

The present disclosure provides photoactive devices such as photodetectors and photovoltaic devices in which semiconducting carbon nanotubes serve as organic photoconductive materials, i.e. as the light-harvesting component. In particular, the present disclosure describes the use of carbon nanotubes as a material for detection of IR radiation in thin film device architecture. In these devices, semiconducting carbon nanotubes act as electron donors and separation of the photogenerated charges takes place at a heterojunction between the semiconducting carbon nanotubes and an organic semiconductor. Appropriate selection of the diameter and optical band gaps of the semiconducting carbon nanotubes may be used to vary the responsivity of the photoactive device from the visible to the near-infrared region of the spectrum. Representative materials, device architectures, and procedures for fabricating the architectures are outlined herein.

According to an embodiment of the present disclosure, at least one or both of the organic acceptor and donor layers in the photoactive region of the photoactive device includes carbon nanotubes. The present disclosure describes the use of carbon nanotubes as optically active components of large-area optoelectronic devices.

The inventors have discovered that excitons (bound electron-hole pairs) in CNTs can be efficiently dissociated by interfacing CNTs with an electron acceptor such as $C_{60}$. The two fullerene-based materials form a donor-acceptor heterojunction with band/orbital offsets that are sufficient to result in electron transfer from the CNTs to $C_{60}$. The combination of the visible absorptivity of the organic semiconductors and the near-IR absorptivity of the CNTs results in broadband sensitivity to electromagnetic illumination ranging from 400-1450 nm in wavelength. The $C_{60}$ can be deposited by vacuum thermal evaporation ("VTE"), organic vapor phase deposition ("OVPD") and other methods. In a preferred embodiment, the VTE deposition of $C_{60}$ is desired.

The present disclosure also includes photoactive device structures that show further improvements in performance in the near-IR spectrum. According to one embodiment, such a photoactive device comprises a first electrode, a second electrode and a photoactive region disposed between and electrically connected to the first electrode and the second electrode. The photoactive region comprises a first organic photoactive layer comprising a first donor material formed above the first electrode and a second organic photoactive layer comprising a first acceptor material formed above the first organic photoactive layer. The first donor material comprises photoactive polymer-wrapped carbon nanotubes. The device also includes one or more additional organic photoactive material disposed between the first and the second organic photoactive material layers, wherein the additional organic photoactive material serving as a donor relative to the first acceptor material or as an acceptor relative to the first donor material. The photoactive region of this improved photoactive device creates excitons upon absorption of light in the range of about 400 nm to 1450 nm.

BRIEF DESCRIPTION OF THE DRAWINGS

FIG. 12A-12D show calculated optical field plots for simulated photovoltaic device structures of FIG. 9A having four different $C_{60}$ thicknesses.

The features shown in the above referenced drawings are illustrated schematically and are not intended to be drawn to scale nor are they intended to be shown in precise positional relationship. Like reference numbers indicate like elements.

DETAILED DESCRIPTION

In the following detailed description of the preferred embodiments, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

An organic photosensitive optoelectronic device according to an embodiment of the present disclosure can be used, for example, to detect incident electromagnetic radiation particularly electromagnetic radiation in the IR and near-IR spectrum or as a solar cell to generate power. Embodiments of the present invention may comprise an anode, a cathode, and a photoactive region between the anode and the cathode, wherein semiconducting polymer-wrapped carbon nanotubes and an organic semiconductor form a heterojunction within the photoactive region. The photoactive region is the portion of the photosensitive device that absorbs electromagnetic radiation to generate excitons that may dissociate in order to generate an electrical current. Organic photosensitive optoelectronic devices may also include at least one transparent electrode to allow incident radiation to be absorbed by the device.

Figure 6:
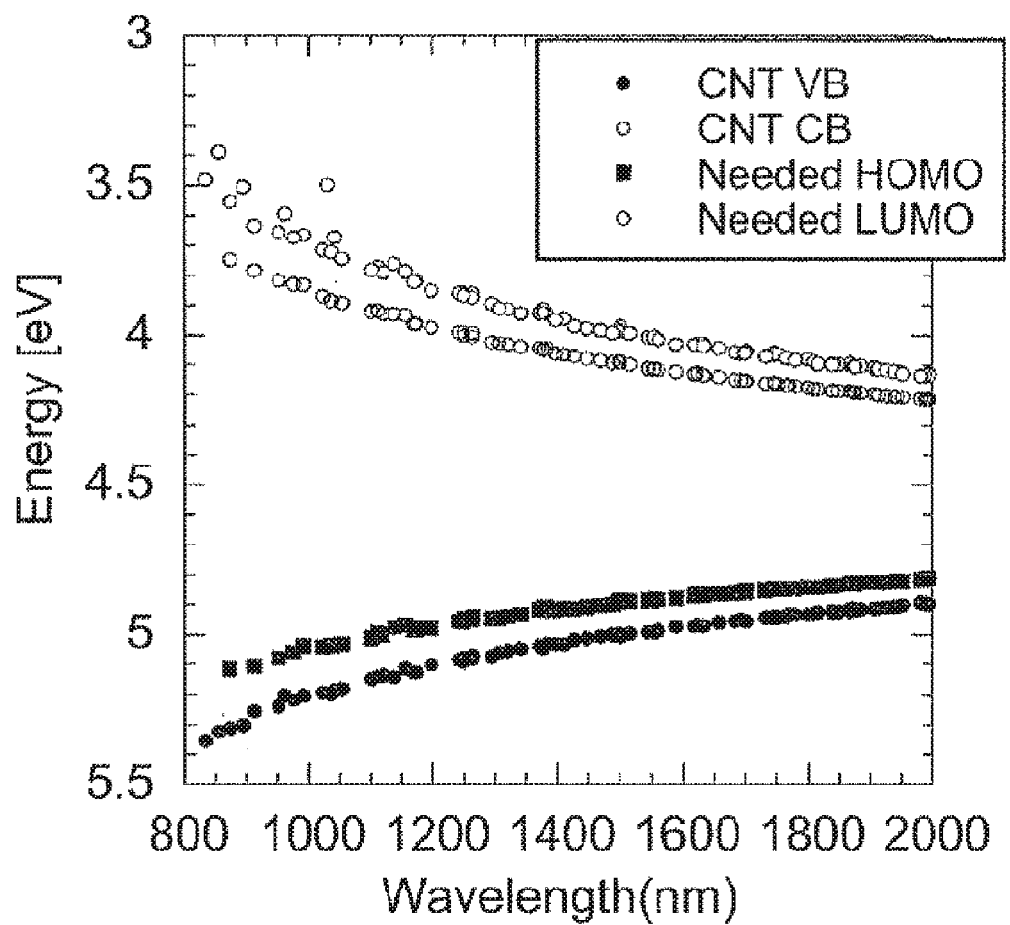
FIG. 6 shows the conduction band (CB) and valence band (VB) energies of CNTs for different absorption wavelengths as well as the necessary energies for acceptable donors or acceptors.

An efficient photosensitive optoelectronic device formed of carbon nanotubes contains compounds with proper energies such that the exciton created by absorption of a photon by a carbon nanotube is split into a free electron and a free hole. To efficiently split the exciton, the HOMO of the donor material should be higher in energy (less negative) than the valance band (VB) of the carbon nanotube-based acceptor. Or conversely, the LUMO of the acceptor material must be less than (more negative) than the conduction band (CB) of the carbon nanotube-based donor. The CB and VB energies as well as the necessary energies for acceptable donors or acceptors are shown in FIG. 6 (see R. B. Weisman, et al. NANO LETT 3 (2003)).

As used herein, the term "rectifying" denotes, inter alia, that an interface has an asymmetric conduction characteristic, i.e., the interface supports electronic charge transport preferably in one direction. The term "semiconductor" denotes materials which can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct (i.e., transport) electric charge in a material. The term "photoconductive material" refers to semiconductor materials which are utilized for their property of absorbing electromagnetic radiation to generate electric charge carriers. As used herein, "top" means furthest away from the substrate, while "bottom" means closest to the substrate. There may be intervening layers (for example, if a first layer is "on" or "over" a second layer), unless it is specified that the first layer is "in physical contact with" or "directly on" the second layer; however, this does not preclude surface treatments (e.g., exposure of the first layer to hydrogen plasma).

Figure 1A:
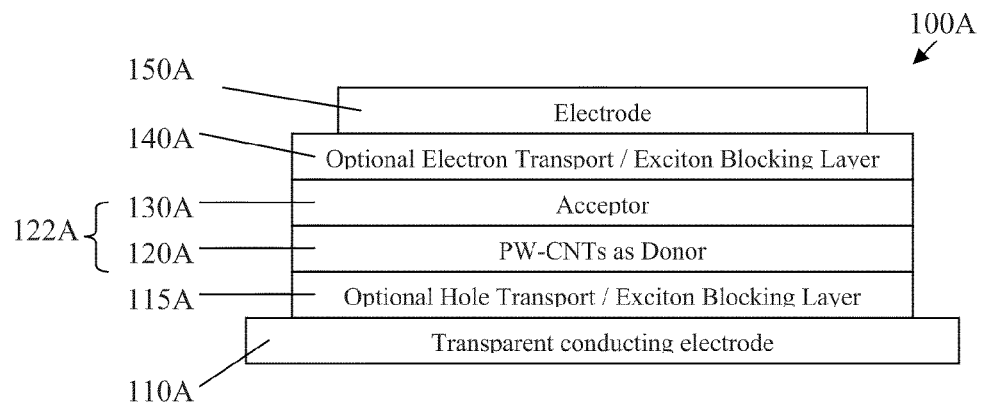
FIGS. 1A and 1B illustrate the architectures of planar heterojunction embodiments of the present disclosure.
Figure 1B:
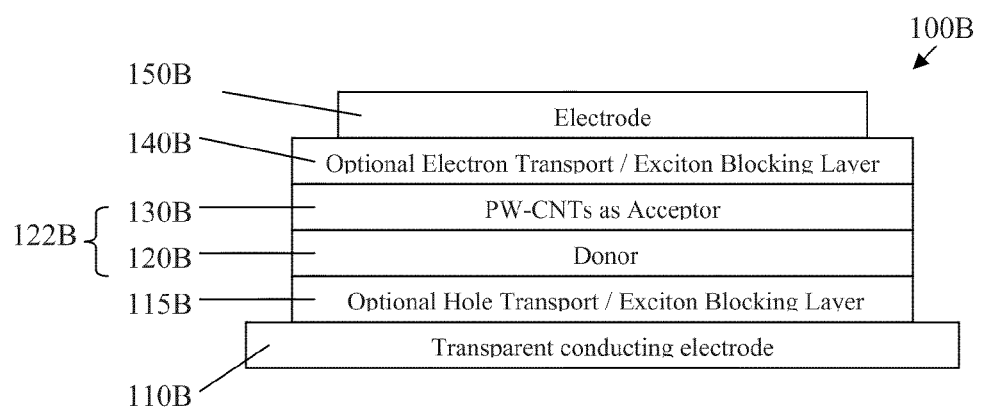

Referring to FIGS. 1A and 1B, architectures of two planar heterojunction embodiments for a photovoltaic device 100A and 100B are disclosed. The photovoltaic device 100A comprises a conducting anode layer 110A, an electron donor layer 120A formed above the anode layer 110A, an electron acceptor layer 130A formed above the donor layer 120A and a conducting cathode layer 150A formed above the electron acceptor layer 130A. In this embodiment, a thin film of polymer-wrapped carbon nanotubes form the electron donor layer 120A. A planar heterojunction is formed between the electron donor layer 120A and the electron acceptor layer 130A. The electron donor layer 120A and the electron acceptor layer 130A form the photoactive region 122A of the device 100A. Preferably, the polymer-wrapped carbon nanotubes (PW-CNTs) are substantially semiconducting polymer-wrapped single-wall carbon nanotubes (PW-SWNTs). Although PW-SWNTs are preferred, polymer-wrapped carbon nanotubes including multi-walled carbon nanotubes are within the scope of the invention disclosed herein. Therefore, in the various embodiments presented herein, when PW-SWNTs are mentioned in connection with a PV device, those embodiments are only examples and other embodiments using PW-CNTs generally, including polymer-wrapped multi-walled carbon nanotubes, are within the scope of the present disclosure.

When the PW-CNTs are used as the electron donor, suitable organic semiconductors for forming the electron acceptor layer 130A include, but are not limited to, $C_{60}$ having a LUMO of −4.0 eV, [84]PCBM ([6,6]-Phenyl $C_{84}$ butyric acid methyl ester) having a LUMO of −4.1 eV, $F_{16}$-CuPc having a LUMO of −4.4 eV, PTCBI (3,4,9,10 perylenetetracarboxylic bisbenzimidazole) having a LUMO of −4.0 eV, PTCDA (3,4,9,10 perylene-tetracarboxylic dianhydride) having a LUMO of −4.7 eV, or Poly(benzimidazobenzo phenanthroline) having a LUMO of −4.5 eV, TCNQ (7,7,8,8-tetracyanoquinodimethane) having a LUMO of 3.9 eV, F4-TCNQ (tetrafluorotetracyanoquinodimethane) having a LUMO of 5.2 eV, and the like.

The organic semiconductor for the electron acceptor layer 130A is preferably capable of efficiently delivering the electrons to the cathode 150A, or to an electron transport layer. These suitable organic semiconductors for the electron acceptor layer 130A typically have a LUMO of lower energy than the LUMO of the carbon nanotubes, so that electron transfer from the irradiated carbon nanotubes (preferably PW-SWNTs) is rapid and irreversible.

There are many different organic semiconductors that could form a rectifying heterojunction with semiconducting PW-CNTs, which results in charge separation and charge transfer of photogenerated charge and a photovoltaic effect. For a CNT with an optical band gap of 1 eV and an exciton binding energy of 0.5 eV, the expected HOMO-LUMO or electrical band gap would be 1.5 eV. Assuming a p-type doping and taking 4.6 eV as the work-function (see calculations of V. Barone, J. E. Peralta, J. Uddin et al., J, Chem. Phys. 124(2) (2006)), the LUMO or conduction band would sit at 3.5 eV with reference to vacuum while the HOMO or valence band would sit at 5.0 eV from vacuum. Thus, such a semiconducting PW-CNT would form a rectifying heterojunction with $C_{60}$ as the electron acceptor.

As noted above, the exact band energy levels of semiconducting CNTs depend on their diameter, chiral twist, electrical band gap, optical band gap, local dielectric environment, and doping. Thus, semiconducting CNTs can serve as either electron accepting material or electron donating material in a heterojunction with another organic semiconductor, depending on the structure of the nanotube and the properties of the organic semiconductor. In addition to small molecule organic semiconductors, conducting polymers could be utilized as either an electron accepting or electron donating materials as well.

In the embodiment shown in FIG. 1B, the photovoltaic device 100B comprises a conducting anode layer 110B, an electron donor layer 120B formed above the anode layer 110B, an electron acceptor layer 130B, and a conducting cathode layer 150B. In this embodiment, a thin film of polymer-wrapped carbon nanotubes form the electron acceptor layer 130B. A planar heterojunction is formed between the electron donor layer 120B and the electron acceptor layer 130B. The electron donor layer 120B and the electron acceptor layer 130B form the photoactive region 122B of the device 100B.

Preferably, the polymer-wrapped carbon nanotubes are substantially semiconducting PW-SWNTs. Carbon nanotubes may be single-walled or multi-walled. Multi-walled nanotubes contain multiple layers of graphite arranged concentrically in a tube. Generally, SWNTs exhibit better electrical properties than multi-walled nanotubes. SWNTs commercially available in bulk quantity are generally manufactured using either a high-pressure carbon monoxide (HiPCO®) process (such as HiPCO® nanotubes available from Unidym of Menlo Park, Calif., U.S.A.) or an arc-discharge process (such as P3 nanotubes from Carbon Solutions Inc., which are purified arc-discharge nanotubes with two open ends linked with hydrophilic carboxyl groups).

As used herein, "substantially semiconducting PW-SWNTs" refer to populations of PW-SWNTs in which at least 80% by weight of the nanotubes are of the semiconducting variety, i.e. non-metallic. It will be appreciated that as the fraction of conducting nanotubes is reduced, the density of nanotubes in the photoactive regions of the photodetecting devices may be increased while maintaining a very low probability of percolating conducting paths. Accordingly, in preferred embodiments, at least 90% of the nanotubes are of the semiconducting variety, and in more preferred embodiments, at least 95% are of the semiconducting variety. In the most preferred embodiments, at least 99% of the nanotubes are of the semiconducting variety.

In a typical CNT mixture, one third of CNTs are metallic in nature while the remaining two thirds are semiconducting, with optical and electrical band gaps that roughly vary inversely with diameter. This heterogeneity presents an obstacle to the fabrication of efficient photovoltaic solar cells from as-produced CNT mixtures, due to excitonic quenching and nonrectifying electrical paths associated with the presence of metallic CNTs. Isolated semiconducting carbon nanotube preparations are necessary to create an efficient organic-semiconductor-semiconducting carbon nanotube heterojunction photovoltaic solar cell. At present, the only way to isolate semiconducting SWNTs is via post-synthesis processing methods.

Currently, a few such processing methods exist for enriching or isolating semiconducting CNTs on the laboratory scale. These methods include "constructive destruction" (P. C. Collins, M. S. Arnold, and P. Avouris, Science 292(5517), 706 (2001)); selective etching of metallic CNTs in monolayer thin films (G. Y. Zhang, P. F. Qi, X. R. Wang et al., Science 314(5801), 974 (2006)); field-flow fractionation based on dielectrophoresis (H. Q. Peng, N. T. Alvaret, C. Kittrell et al., J. Amer. Chem. Soc. 128(26), 8396 (2006)); and anion exchange chromatography of DNA-wrapped CNTs (M. Zheng, A. Jagota, M. S. Strano et al., Science 302(5650), 1545-1548 (2003)). However, the effectiveness of many of these techniques (the proportion of obtained CNTs that are semiconducting) is limited or unclear, and there are significant drawbacks to these techniques that render them impractical for producing usable quantities of semiconducting CNTs.

When the PW-CNTs are used as the electron acceptors, suitable organic semiconductors for forming the electron donor layer 120B include, but are not limited to, BTEM-PPV (Poly(2,5-bis(1,4,7,10-tetraoxaundecyl)-1,4-phenylenevinylene) having a HOMO of −4.97 eV, Poly(3-decyloxythiophene) having a HOMO of −4.5 eV, CuPc (copper phthalocyanine) having a HOMO of 5.3 eV, NPD (4,4'-bis(N-(1-napthyl)phenylamino)biphenyl) having a HOMO of 5.4 eV, pentacene having a HOMO of 5.0 eV, tetracene having a HOMO of 5.4 eV, and the like. The organic semiconductor for the electron donor layer 120B should be capable of efficiently delivering the holes to the anode 110B, or to a hole transport layer. The suitable organic semiconductors for the electron donor layer 120B are preferably those having a HOMO of higher energy than the HOMO of the carbon nanotubes, so that hole transport from (electron transfer to) the irradiated CNTs is rapid and irreversible.

In both embodiments 100A and 100B, an optional exciton blocking layer 140A, 140B can be provided between the photoactive regions 122A, 122B and the cathode layers 150A, 150B, respectively. Additionally, an optional exciton blocking layer 115A, 115B can be provided between the photoactive regions 112A, 122B and the anode layers 110A, 110B, respectively. An anode-smoothing layer may also be situated between the anode and the donor. Anode-smoothing layers are described in U.S. Pat. No. 6,657,378 to Forrest et al., incorporated herein by reference for its disclosure related to this feature Polymer Wrapping The carbon nanotubes, as produced, are highly agglomerated and bundled. To get efficient optical absorption and exciton splitting and to prevent exciton quenching, the tubes must be debundled. This is done through a known polymer wrapping process. The carbon nanotubes are placed into a solution of polymer and the appropriate solvent and the carbon nanotubes are separated using a high-power horn sonicator (cell dismembrator). If an appropriate polymer is used (various poly-thiophene polymer, poly-phenylenevinylene polymer, and poly-fluorene polymer derivatives, amongst others) the polymer will wrap with soluble side-groups on the polymer creating a carbon nanotube-polymer complex that is soluble. The main purpose of the polymer wrapping is to suspend individual nanotubes. A polymer that will form a donor-acceptor heterojunction with the carbon nanotubes so as to facilitate the splitting of the exciton is not necessary for the wrapping material, as long as another material is present in the device that can form a donor-acceptor heterojunction with the PW-CNTs.

After the carbon nanotubes are polymer wrapped and solubilized, a photovoltaic device can be made by incorporating them into a donor or acceptor molecule or polymer, if needed, and casting into a device. To create a photovoltaic device with sufficient carbon nanotubes to absorb an appreciable amount of light may require a high enough concentration of carbon nanotubes that create a percolating network (greater than ~1% by weight carbon nanotubes in the film). This means that any metallic carbon nanotubes that touch a semiconducting carbon nanotube will act as an exciton quenching center and will drastically reduce the efficiency of the photovoltaic device. Also, the metallic carbon nanotubes could act to short out the device by creating metal fibers that traverse the entire cell thickness leading to a reduced shunt resistance. To avoid this phenomenon, the carbon nanotubes are sorted by a method, such as density gradient ultracentrifugation, so that nearly all of the metallic carbon nanotubes are removed and the exciton quenching is significantly reduced.

In some embodiments, photoactive polymers such as poly [2-methoxy-5-(3',7'-dimethyloctyloxy)-1,4-phenylenevinylene] (MDMO-PPV), poly[2-methoxy-5-(2'-ethyl-hexyloxy)-1,4-phenylene vinylene] (MEH-PPV) and poly(9,9-dioctylfluorenyl-2,7-diyl) (PFO) can be used to wrap and solubilize the carbon nanotubes. In such embodiments, the photoactive polymers wrapping the CNTs absorb light creating excitons that are separated at the wrapping polymer-to-carbon nanotube or wrapping polymer-to-organic (donor or acceptor) interface independent of the CNTs.

Other examples of photoactive polymers that can be used to wrap the SWNTs are PFO: Poly(9,9-dioctylfluorenyl-2,7-diyl) and polymers with the same backbone and different solublizing groups such as or PFH-Poly(9,9-dihexylfluorenyl-2,7-diyl) or Poly[9,9-di-(2-ethylhexyl)-fluorenyl-2,7-diyl]. Another extension is that sometimes copolymers can be used (alternating between PFO and another monomer such as Poly[(9,9-dioctylfluorenyl-2,7-diyl)-alt-(1,4-vinylenephenylene)], Poly[(9,9-dioctylfluorenyl-2,7-diyl)-alt-(vinyleneanthracene)], or Poly[9,9-dioctylfluorenyl-2,7-diyl)-co-1,4-benzo-{2,1'-3}-thiadiazole)].

Another example is phenylenevinylene based polymers: such as MDMO-PPV-Poly[2-methoxy-5-(3,7-dimethyl-octyloxy)-1,4-phenylenevinylene) or MEH-PPV-Poly[2-methoxy-5-(2-ethyl-hexyloxy)-1,4-phenylenevinylene] and polymers with the same backbone and different solublizing groups such as poly[2,5-bis(3,7-dimethyloctyloxy)-1,4-phenylene-vinylene]. Sometimes backbone alternates such as copolymers can be used (alternating between PFO and another monomer such as Poly[(9,9-dioctylfluorenyl-2,7-diyl)-alt-(1,4-vinylenephenylene)], Poly[(9,9-dioctylfluorenyl-2,7-diyl)-alt-(vinyleneanthracene)], or Poly[9,9-dioctylfluorenyl-2,7-diyl)-co-1,4-benzo-{2,1'-3}-thiadiazole)].

Thiophene based polymers such as P3HT or those using other solublizing groups could be used: P3BT-poly(3-butyl-thiophene-2,5-diyl); P3HT-poly(3-hexyl-thiophene-2,5-diyl); P3OT-poly(3-octal-thiophene-2,5-diyl); P3DT-poly(3-decyl-thiophene-2,5-diyl), etc. Sometimes backbone alternates such as copolymers can be used (alternating between PFO and another monomer such as Poly[(9,9-dioctylfluorenyl-2,7-diyl)-alt-(1,4-vinylenephenylene)], Poly [(9,9-dioctylfluorenyl-2,7-diyl)-alt-(vinyleneanthracene)], or Poly[9,9-dioctylfluorenyl-2,7-diyl)-co-1,4-benzo-{2,1'-3}-thiadiazole)]. Other conducting polymer backbones such as PPE polymers: Poly(2,5-dioctyl-1,4-phenylene), with the same additions and low-bandgap polymers such as poly[2,6-(4,4-bis-(2-ethylhexyl)-4H-cyclopenta[2,1-b; 3,4-b]-dithiophene)-alt-4,7-(2,1,3-benzothiadiazole)] (PCPDTBT) are also suitable. Variations might be made to the backbone or alternating unit.

Figure 7:
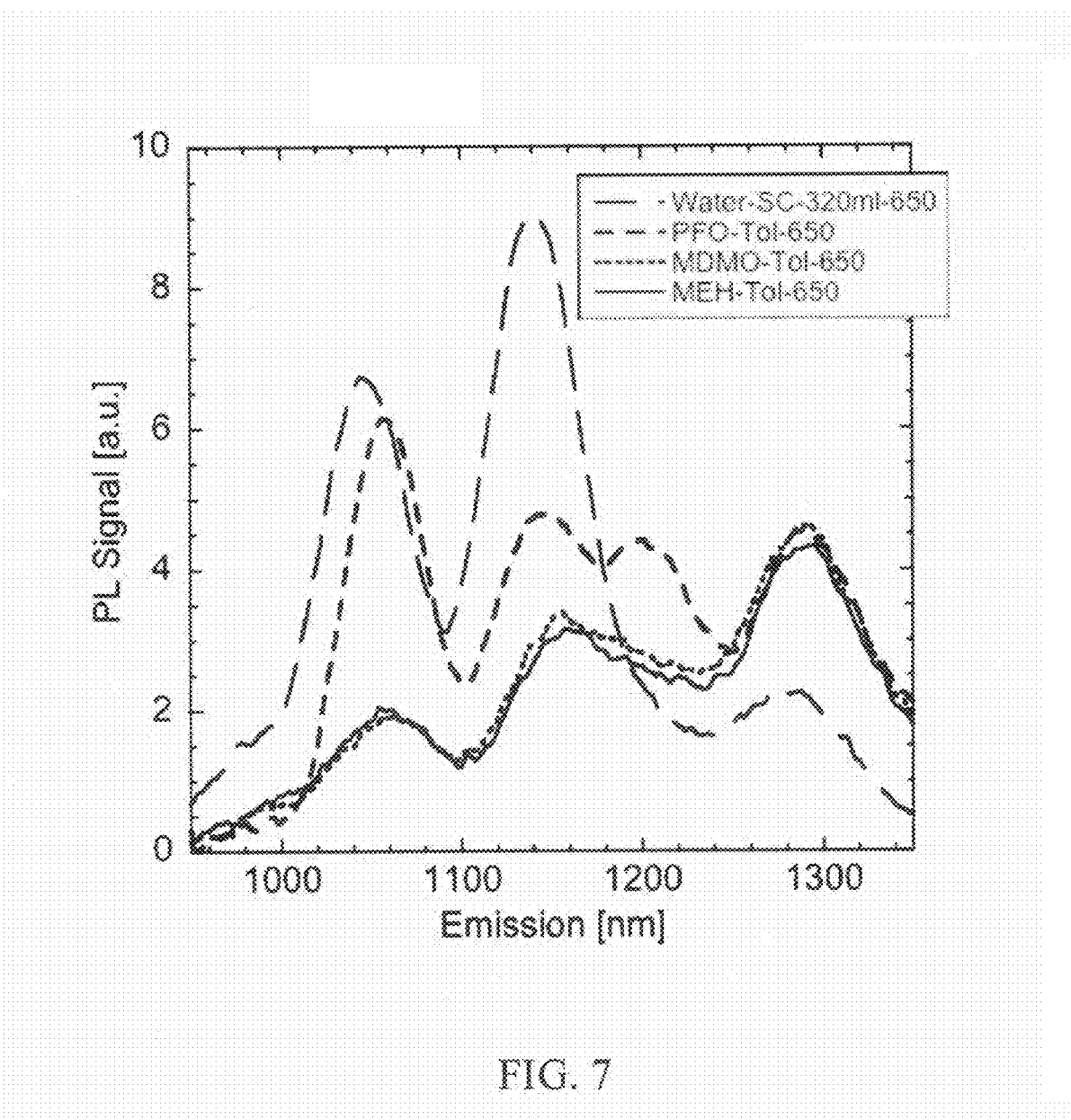
FIG. 7 shows the photoluminescence of polymer-wrapped carbon nanotubes suspended in toluene, excited at 650 nm.

FIG. 7 shows the photoluminescence of polymer-wrapped carbon nanotubes suspended in toluene, excited at 650 nm, showing that the wrapping works well with MDMO-PPV, and that for certain carbon nanotube chiralities, PFO gives much brighter photoluminescence. The signal intensity is an indicator of the amount of carbon nanotubes that are individually dispersed. Aggregated and bundled nanotubes show no photoluminescence signal because of quenching due to metallic nanotubes in contact with semiconducting nanotubes. This shows that MDMO-PPV is comparable to MEH-PPV in its ability to solubilize carbon nanotubes in toluene. This suggests that minor changes to the side-groups do not significantly alter the wrapping efficiency and that many similar polymers may be used.

MDMO-PPV wrapping imparts solubility to the carbon nanotubes in organic solvents thus facilitating their solution-based processing. The MDMO-PPV was also expected to effectively isolate the carbon nanotubes from one-another, thus minimizing the direct electronic coupling between the optically active semiconducting nanotubes and any quenching metallic nanotubes.

In the inventors' experiments, the carbon nanotubes were first wrapped by a semiconducting polymer, poly[2-methoxy-5-(3',7'-dimethyloctyloxy)-1,4-phenylenevinylene] (MDMO-PPV). High pressure carbon monoxide (HiPCO)

grown nanotubes that varied from 0.7-1.1 nm in diameter were utilized because to insure spectral responsivity extending to 1400 nm in wavelength. The MDMO-PPV wrapped nonotubes were purified by centrifugation in order to remove bundles of nanotubes and insoluble material. The polymer-nanotube mixture was spread over a hot indium tin oxide (ITO)-coated glass substrate via doctor-blading in an inert nitrogen atmosphere. A thin film of $C_{60}$ was deposited on top of the polymer-nanotube mixture to form the donor-acceptor interface, followed by a 10 nm buffer layer of 2,9-dimethyl-4,7-diphenyl-1,10-phenanthroline (BCP), and then the Ag cathode. In a preferred embodiment, the $C_{60}$ is deposited by VTE.

Figure 8:
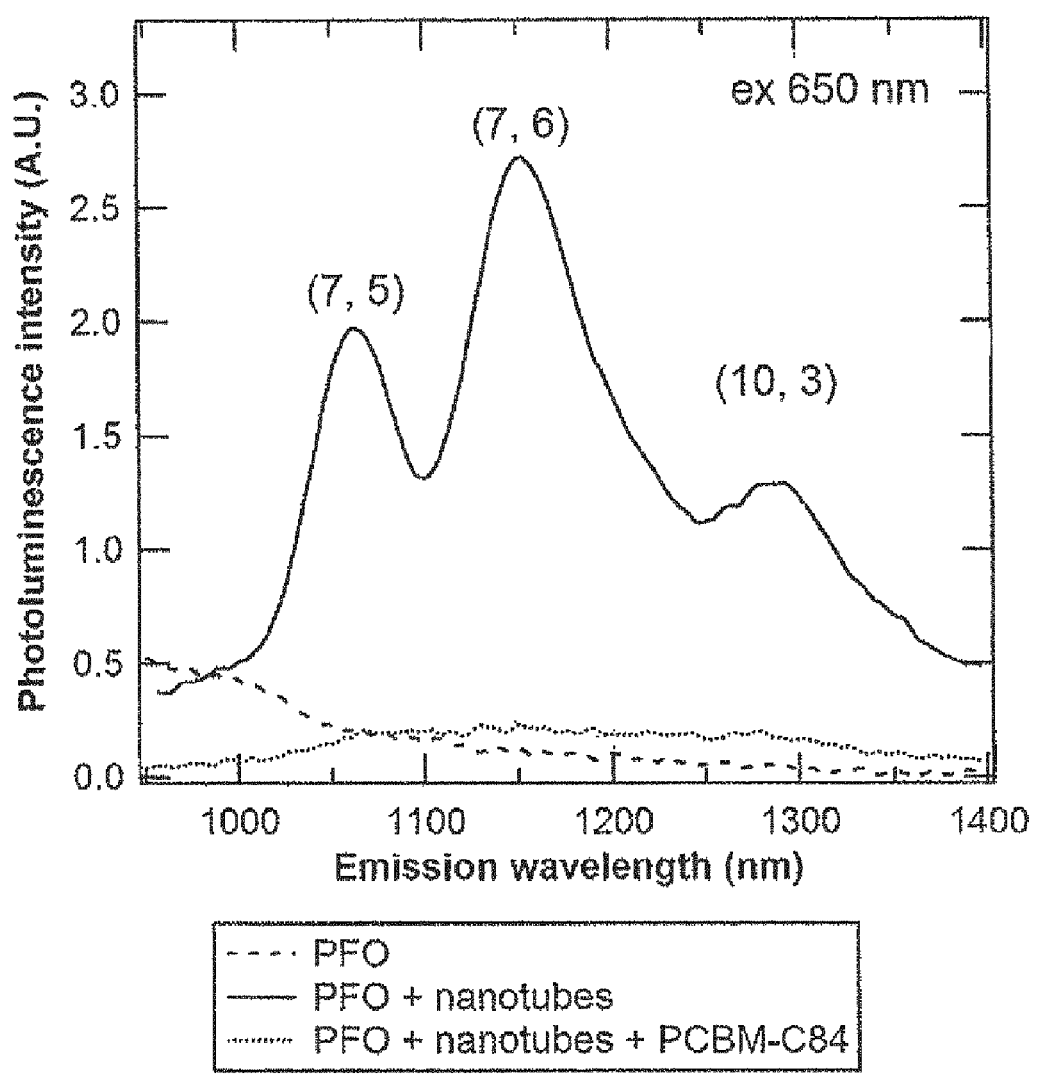
FIG. 8 shows photoluminescence intensity of thick films containing PFO and CNTs doctor bladed from toluene solution.

FIG. 8 shows the inventors' experimental results on [84] PCBM that verifies that the theoretical quenching due to the energy levels described in FIG. 6 is relatively accurate. The data shown in FIG. 8 were taken from a thick film doctor bladed from toluene solutions. The film containing PFO and CNTs is a reference for the effect of adding fullerene additives. The addition of [84] PCBM completely quenches all nanotube luminescence in the wavelength probed (950 to 1350 nm when excited at 650 nm), indicating that the [84] PCBM energy level is deeper than the LUMO minus the exciton binding energy, and results in efficient splitting of excitons in the CNTs. This indicates that [84] PCBM is an effective material for splitting excitons on the CNTs. Therefore, [84] PCBM is an effective electron acceptor material to be used in conjunction with the substantially semiconducting PW-CNTs used as the photoconductive material.

Figure 9A:
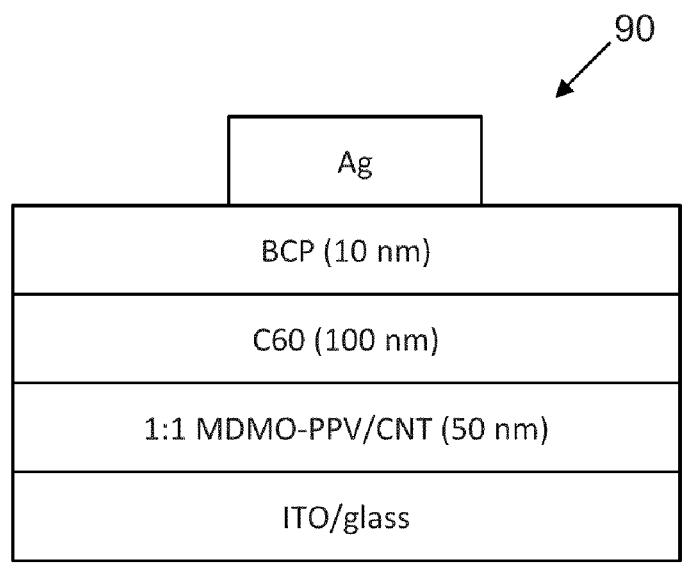
FIG. 9A shows an example of architecture of a polymer-wrapped carbon nanotube/$C_{60}$ heterojunction diode with a 1:1 ratio of MDMO-PPV to nanotubes, by weight.
Figure 9B:
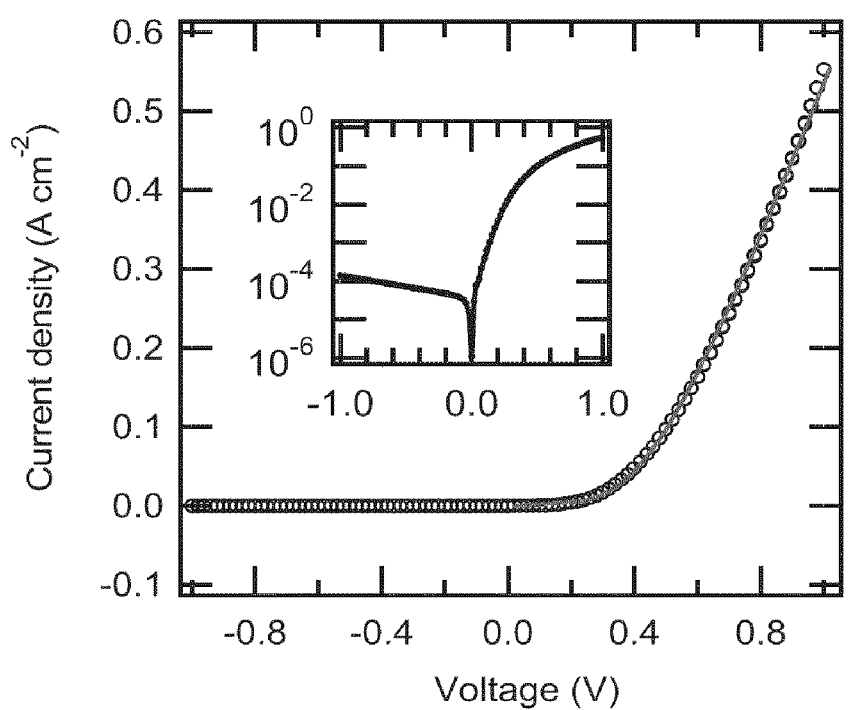
FIG. 9B shows the current-voltage characteristics of the device of FIG. 9A.
Figure 9C:
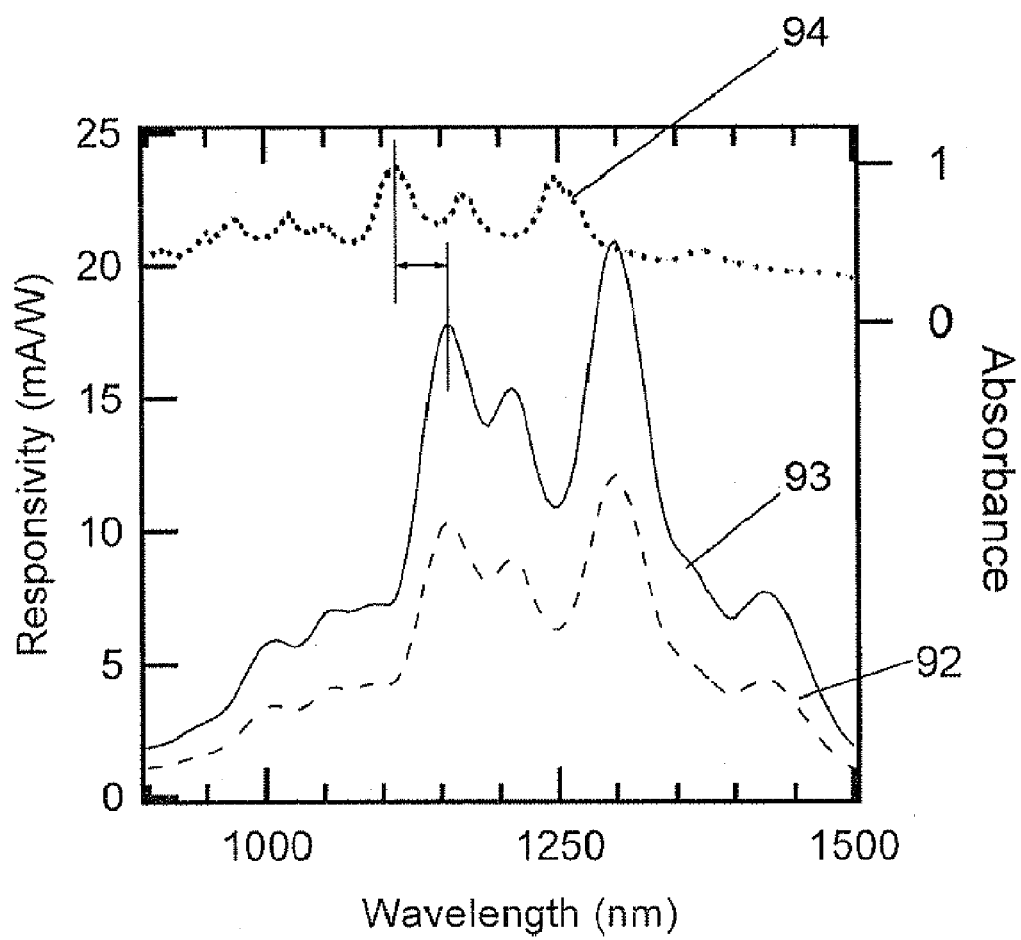
FIG. 9C shows the spectrally resolved photoresponsivity of the device of FIG. 9A.

Referring to FIGS. 9A-9D, the current-voltage characteristics (FIG. 9B) and spectrally resolved photoresponsivity (FIG. 9C) of a PW-CNT/$C_{60}$ heterojunction diode with a 1:1 ratio of MDMO-PPV to nanotubes, by weight, shown in FIG. 9A are depicted. The thickness of the layers in the device are provided in FIG. 9A. The diodes have rectification ratios of more than four orders of magnitude under dark conditions (FIG. 9B). The forward bias current-voltage characteristics follow the Shockley diode equation with a diode ideality factor of 2.5 and a series resistance of 120Ω. Referring to FIG. 9C, the near-IR responsivity of the diodes at 0V bias (plot line 92) and –0.5V bias (plot line 93) is compared with the absorption spectrum of isolated semiconducting CNTs in an aqueous surfactant solution of sodium cholate in de-ionized $H_2O$ (plot line 94). The photoresponsivity is red-shifted by about 40 meV from the solution absorption spectrum but follows the same shape. The peak photoresponsivity of the devices at 1155 nm at a bias of 0V (plot line 92) and –0.5V (plot line 93) was about 10 and 17 mA/W, respectively. In comparison, the responsivity of control devices without carbon nanotubes was immeasurable in the near-infrared (<0.1 μA/W).

Figure 9D:
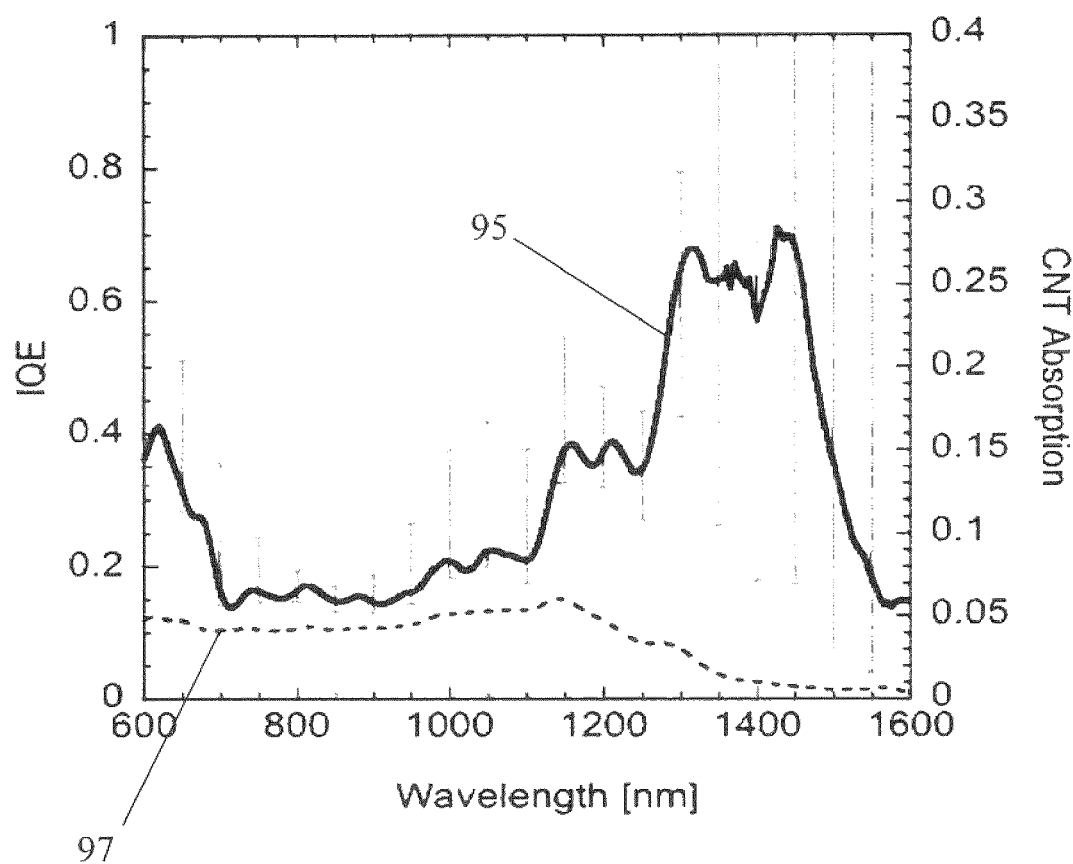
FIG. 9D shows the internal quantum efficiency (IQE) of the device of FIG. 9A and absorptivity of polymer wrapped carbon nanotubes.

FIG. 9D is a plot of the internal quantum efficiency (IQE) of the device of FIG. 9A. (See solid line 95). IQE is the ratio of the photoresponsivity of the device under –0.5V bias (plot line 93 in FIG. 9C) to the near-IR absorbtivity of the PW-CNTs (dashed line 97 in FIG. 9D). The near-IR absorptivity of the PW-CNTs (dashed line 97) was quantified by measuring the spectrally resolved reflectivity of the device and then subtracting the absorption due the ITO. As shown, the peak IQE in the near-IR exceeds about 20% over the broad spectral range of 1000 to 1350 nm. The substantially large IQE indicates that there is a favorable mechanism for exciton dissociation in the devices.

Figures 10A, 10B, 10C:
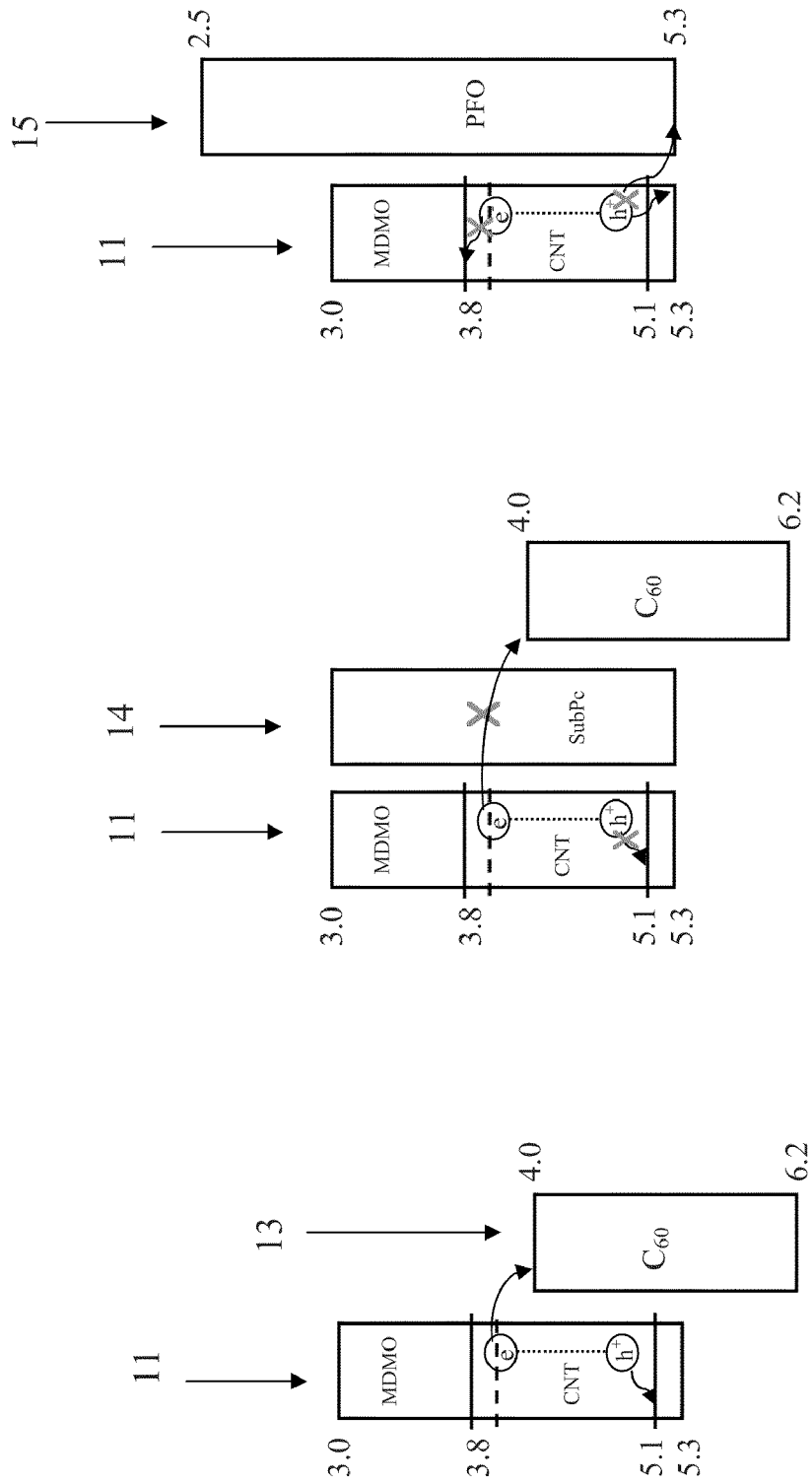
FIG. 10A is a schematic energy level diagram for a polymer wrapped carbon nanotube/$C_{60}$ heterojunction according to an embodiment of the present disclosure.
FIGS. 10B and 10C are schematic energy level diagrams of two control devices.

To test the hypothesis that the active/dissociating interface in our device was the PW-CNT/$C_{60}$ interface, the inventors fabricated two control device architectures in which the PW-CNT/$C_{60}$ interface was broken. The schematic energy diagrams of these structures are shown in FIGS. 10B and 10C. In the first control device architecture shown in FIG. 10B, a 40 nm layer of sub phthalocyanine (SubPc) 14 was inserted between the PW-CNT layer 11 and the $C_{60}$ layer 13 to break the PW-CNT/$C_{60}$ interface. The HOMO and LUMO energies of SubPc are similar to those in the MDMO-PPV. The second control device architecture was fabricated to test for exciton dissociation within the MDMO-PPV wrapped carbon nanotube layer, itself. In this architecture, the $C_{60}$ layer 13 was removed and a buffer layer of PFO 15 was inserted as a hole transport layer between the ITO and the PW-CNT layer 11 to prevent the nanotubes from directly bridging the anode and cathode. The corresponding energy diagram for the second control device architecture is shown in FIG. 10C.

Near-IR responsivity originating from the PW-CNTs was not observed in either control device (responsivity <0.1 μA/W) indicating that there was an insufficient driving force for exciton dissociation at the PW-CNT/ITO, PW-CNT/SubPc, and PW-CNT/MDMO-PPV interfaces. Measurable photocurrent in response to near-infrared illumination was only observed when the PW-CNT/$C_{60}$ interface was left intact.

FIGS. 10A-10C show the expected energy alignments between the various organic semiconductors and an (8,4) semiconducting PW-CNT. An (8,4) nanotube has a diameter of 0.84 nm and an expected optical band gap in the polymer matrix at 1155 nm. The electron affinity (EA) and ionization potential (IP) of the nanotube were determined from first principles calculations of the nanotube electronic band structure by Spataru et al., *Excitonic effects and optical spectra of single-walled carbon nanotubes*, PHYSICAL REVIEW LETTERS 92(7) (2004), and Perebeinos et al., Scaling of excitons in carbon nanotubes, Physical Review Letters 92(25) (2004), and of the work function by Barone et al., *Screened exchange hybrid density-functional study of the work function of pristine and doped single-walled carbon nanotubes*, JOURNAL OF CHEMICAL PHYSICS 124(2) (2006). First principles calculations of the electronic structure of $C_{60}$ shows that an offset of 0.2 eV between the EA of the nanotube and the LUMO of $C_{60}$ is expected (see FIGS. 10A and 10B). For comparison, the binding energy of an exciton in an (8,4) semiconducting PW-CNT with a relative dielectric permittivity of 3.5 is expected to be 0.1 eV. Therefore, the energy offset should be sufficient to result in exciton dissociation and charge transfer from the carbon nanotubes to $C_{60}$.

In contrast, exciton dissociation at the interface of the MDMO-PPV and the carbon nanotubes should not be expected. Rather, it is expected that these two materials form a straddling type I heterojunction where both the IP and EA of the carbon nanotubes lie within the HOMO and LUMO levels of MDMO-PPV. The existence of a straddling type I heterojunction between MDMO-PPV and carbon nanotubes has been experimentally supported by photoluminescence spectroscopy in which strong photoluminescence from polymer-wrapped semiconducting carbon nanotubes has been observed at the optical band gap of the nanotubes in response to direct optical exciton of the polymer absorption band.

The planar heterojunctions described above can be formed by depositing a thin film of organic semiconductor directly on top of a percolating network of CNTs. An electron transporting and/or exciton blocking layer 140A may optionally be added, followed by deposition of the cathode layer 150A, to produce the photovoltaic device architecture 100A shown in FIG. 1A. Alternatively, a thin film of CNTs can be stamped onto a thin film of an organic donor material deposited on an anode. Deposition of the optional electron transporting and/ or exciton blocking layer 140B, followed by the cathode layer 150B, produces the photovoltaic device architecture 100B shown in FIG. 1B.

Thin films of percolating networks of CNTs can be prepared by direct growth, by vacuum filtration through porous membranes, spray-based deposition strategies, spin-coating, layer-by-layer deposition approaches, dielectrophoresis, and evaporation.

Figure 2A:
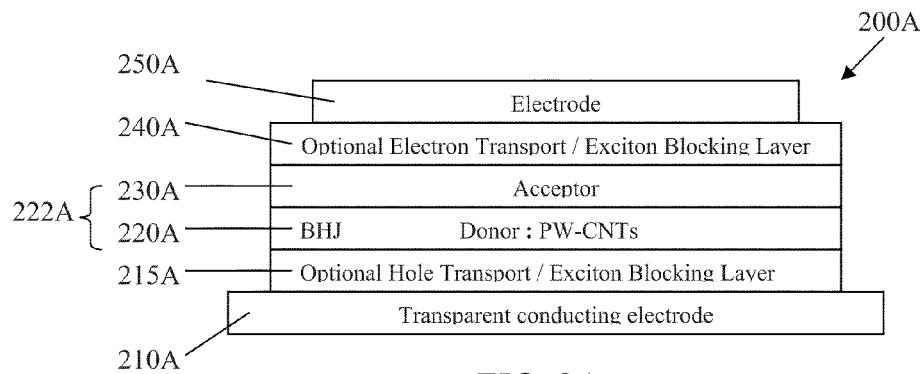
FIGS. 2A-2D illustrate the architectures of bulk heterojunction embodiments of the present disclosure.
Figure 2B:
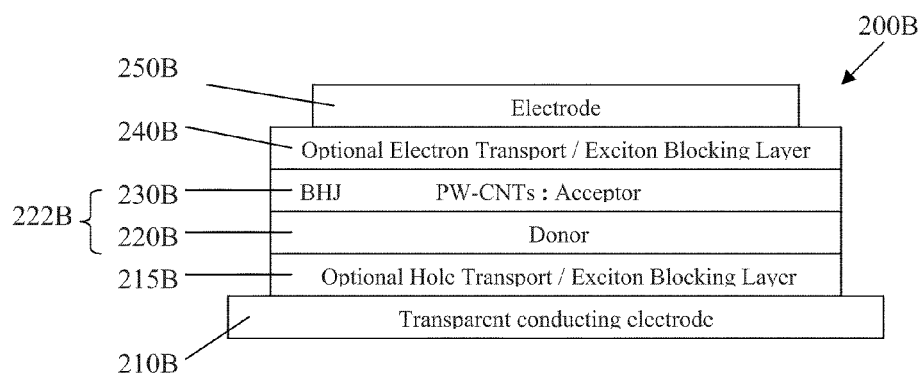

FIGS. 2A-2B show two hybrid planar-bulk heterojunction embodiments for a photovoltaic device 200A and 200B. Referring to FIG. 2A, the photovoltaic device 200A comprises a conducting anode layer 210A and a bulk heterojunction layer 220A comprising polymer wrapped carbon nanotubes disposed within an organic electron donor material formed above the anode layer 210A. An electron acceptor layer 230A is formed above the bulk heterojunction layer 220A and a conducting cathode layer 250A formed above the electron acceptor layer 230A. The bulk heterojunction layer 220A and the electron acceptor layer 230A form the photoactive region 222A of the device 200A. Alternatively, the layers 220A and 230A can be configured such that the polymer wrapped carbon nanotubes in the layer 220A and the electron acceptor material of the layer 230A form a bulk heterojunction.

The suitable organic semiconductor donor materials for forming the bulk heterojunction layer 220A include, but are not limited to, BTEM-PPV (Poly(2,5-bis(1,4,7,10-tetraoxaundecyl)-1,4-phenylenevinylene), Poly(3-decyloxythiophene), CuPc (copper phthalocyanine), NPD (4,4'-bis (N-(1-napthyl)phenylamino)biphenyl), pentacene, tetracene, and the like. The suitable organic semiconductors for the electron acceptor layer 230A include, but are not limited to, $C_{60}$, [84]PCBM ([6,6]-Phenyl $C_{84}$ butyric acid methyl ester), $F_{16}$-CuPc, PTCBI (3,4,9,10 perylenetetracarboxylic bisbenzimidazole), PTCDA (3,4,9,10 perylene-tetracarboxylic dianhydride), or Poly(benzimidazobenzophenanthroline), TCNQ (7,7,8,8-tetracyanoquinodimethane), $F_4$-TCNQ (tetrafluorotetracyanoquinodimethane), and the like.

Referring to FIG. 2B, the photovoltaic device embodiment 200B comprises a conducting anode layer 210B and an electron donor layer 220B formed above the anode layer 210B. A bulk heterojunction layer 230B comprising polymer wrapped carbon nanotubes is disposed within an organic electron acceptor material formed above the donor layer 220B, and a conducting cathode layer 250B is formed above the bulk heterojunction layer 230B. The bulk heterojunction layer 230B and the electron donor layer 220B form the photoactive region 222B of the device 200B.

The suitable organic semiconductor acceptor materials for forming the bulk heterojunction layer 230B include, but are not limited to, $C_{60}$, [84]PCBM ([6,6]-Phenyl $C_{84}$ butyric acid methyl ester), $F_{16}$-CuPc, PTCBI (3,4,9,10 perylenetetracarboxylic bisbenzimidazole), PTCDA (3,4,9,10 perylene-tetracarboxylic dianhydride), or Poly(benzimidazobenzophenanthroline), TCNQ (7,7,8,8-tetracyanoquinodimethane), $F_4$-TCNQ (tetrafluorotetracyanoquinodimethane), and the like. The suitable organic semiconductors for the electron donor layer 220B include, but are not limited to, BTEM-PPV (Poly(2,5-bis(1,4,7,10-tetraoxaundecyl)-1,4-phenylenevinylene), Poly(3-decyloxythiophene), CuPc (copper phthalocyanine), NPD (4,4'-bis(N-(1-napthyl)phenylamino)biphenyl), pentacene, tetracene, and the like.

Figure 2C:
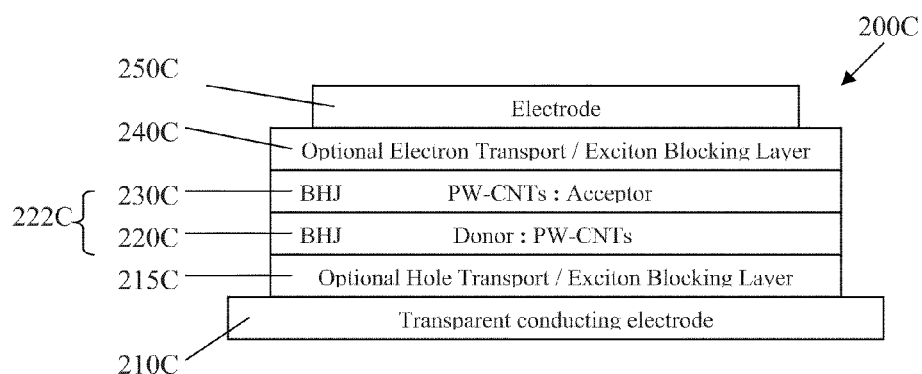

According to another embodiment 200C illustrated in FIG. 2C, both of the electron acceptor layer 230C and the electron donor layer 220C in the photoactive region 222C can be bulk heterojunctions comprising polymer-wrapped carbon nanotubes and the respective acceptor-type or donor-type organic semiconductor materials.

Figure 2D:
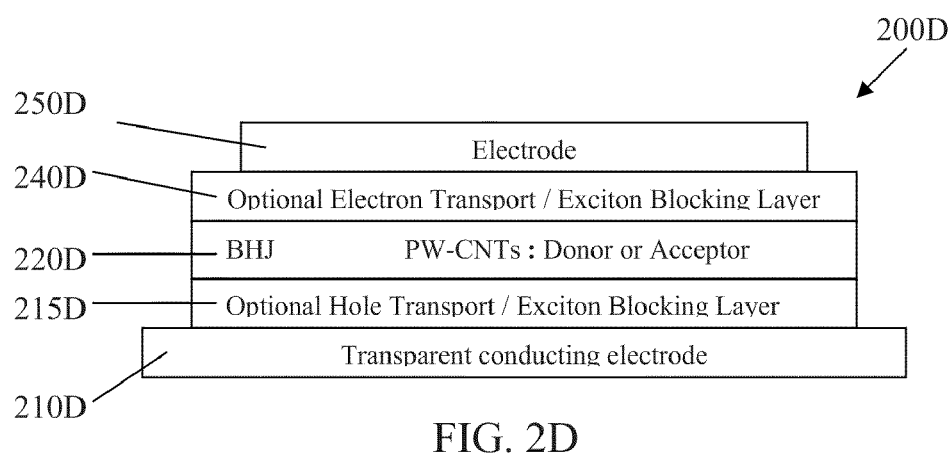

In FIG. 2D, a bulk heterojunction PV device 200D according to another embodiment is shown. The device 200D comprises a conducting anode layer 210D, a conducting cathode layer 250D and a bulk heterojunction layer 220D provided between and electrically connected to the two electrodes. The bulk heterojunction layer 220D comprises polymer-wrapped carbon nanotubes disposed within an organic semiconductor material that can be either an organic electron acceptor or electron donor materials disclosed herein. In this embodiment, the bulk heterojunction layer 220D forms the photoactive region of the device 200D. Optionally, one or more exciton blocking layers can be provided in the device. An exciton blocking layer 215D can be provided between the anode layer 210D and the bulk heterojunction layer 220D. Another exciton blocking layer 240D can be provided between the cathode layer 250D and the bulk heterojunction layer 220D either in conjunction with the first exciton blocking layer 215D or independent of the first exciton blocking layer 215D.

In the devices of 200A, 200B, 200C and 200D, preferably, the polymer-wrapped carbon nanotubes are substantially semiconducting PW-SWNTs. An optional exciton blocking layer 240A, 240B, 240C can be provided between the photoactive regions 222A, 222B, 222C and the cathode layers 250A, 250B, 250C, respectively. Additionally, an optional exciton blocking layer 215A, 215B, 215C can be provided between the photoactive regions 222A, 222B, 222C and the anode layers 210A, 210B, 210C, respectively. An anode-smoothing layer may also be situated between the anode and the donor.

Figure 3A:
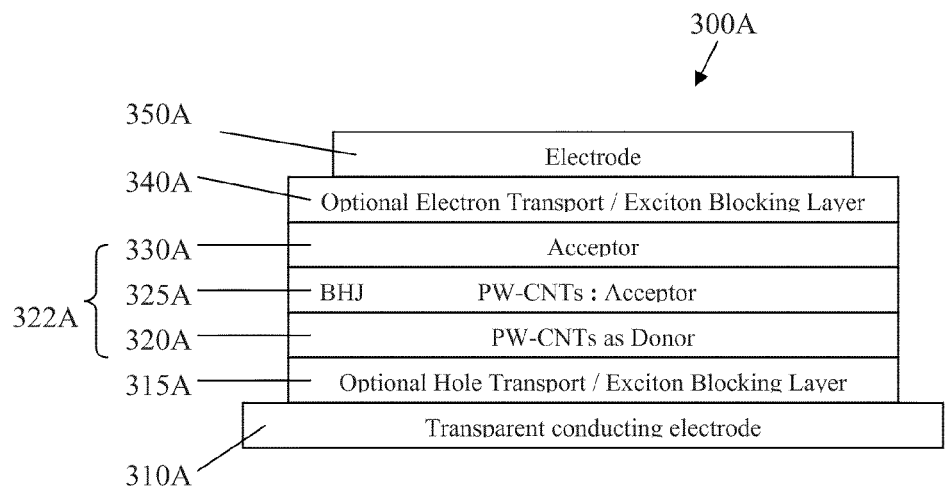
FIGS. 3A and 3B illustrate the architectures of additional bulk heterojunction embodiments of the present disclosure.
Figure 3B:
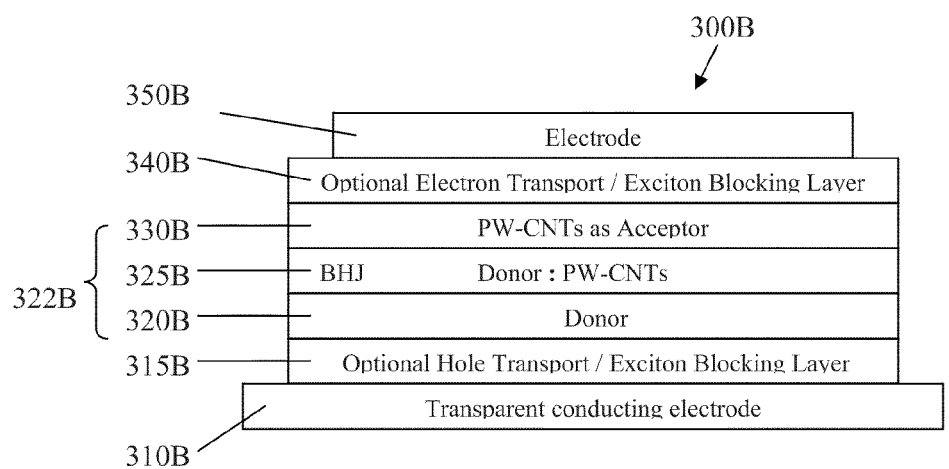

FIGS. 3A-3B show additional hybrid planar-bulk heterojunction embodiments for a photovoltaic device 300A and 300B. Referring to FIG. 3A, the photovoltaic device embodiment 300A comprises a conducting anode layer 310A, a thin film of polymer-wrapped carbon nanotubes as an electron donor layer 320A formed above the anode layer 310A, and a bulk heterojunction layer 325A comprising polymer-wrapped carbon nanotubes disposed within an organic electron acceptor material formed above the donor layer 320A. An electron acceptor layer 330A is formed above the bulk heterojunction layer 325A and a conducting cathode layer 350A is formed above the acceptor layer 330A. The electron donor layer 320A, the bulk heterojunction layer 325A and the electron acceptor layer 330A form the photoactive region 322A of the device 300A.

The suitable organic semiconductor acceptor materials for forming the bulk heterojunction layer 325A and the electron acceptor layer 330A are the same as those discussed in conjunction with the embodiment of FIG. 1A.

Referring to FIG. 3B, the photovoltaic device embodiment 300B comprises a conducting anode layer 310B, an electron donor layer 320B formed above the anode layer 310B and a bulk heterojunction layer 325B comprising polymer-wrapped carbon nanotubes disposed within an organic electron donor material formed above the donor layer 320B. A thin film of polymer-wrapped carbon nanotubes as an electron acceptor layer 330B is formed above the bulk heterojunction layer 325B and a conducting cathode layer 350B is formed above the bulk heterojunction layer 325B. The electron donor layer 320B, the bulk heterojunction layer 325B and the electron acceptor layer 330B form the photoactive region 322B of the device 300B.

As in the embodiment 300A, the suitable organic semiconductor acceptor materials for forming the bulk heterojunction layer 325B are the same as those discussed in conjunction with the embodiment of FIG. 1A. The possible organic semiconductor materials for the electron donor layer 320B are same as those discussed in conjunction with the embodiment of FIG. 1B.

In both embodiments 300A and 300B, the bulk heterojunction layers 325A and 325B can be formed by depositing a mixed film of both organic semiconductor material and polymer-wrapped carbon nanotubes, or by vapor deposition of an organic semiconductor onto a thin mat of polymer-wrapped carbon nanotubes. This bulk heterojunction layer may then be sandwiched between a layer of polymer-wrapped carbon nanotubes (320A, 320B) and a layer of organic semiconductor (330A, 330B).

In both embodiments 300A and 300B, preferably, the polymer-wrapped carbon nanotubes are substantially semiconducting PW-SWNTs. An optional exciton blocking layer 340A, 340B can be connected between the photoactive regions 322A, 322B and the cathode layers 350A, 350B, respectively. Additionally, an optional exciton blocking layer 315A, 315B can be connected between the photoactive regions 322A, 322B and the anode layers 310A, 310B, respectively. An anode-smoothing layer may also be situated between the anode and the donor.

The small molecule organic semiconductors discussed herein can be deposited by vacuum thermal evaporation (VTE), organic vapor phase deposition (OVPD). or via solution-based processing methods. Depending on the background growth pressure, substrate temperature, growth rate, the molecular structure of the organic semiconductor, and the roughness of the substrate, various morphologies and degrees of crystalline order can be obtained, which influence charge transport and interfacial morphology. In the instance in which organic semiconductors are deposited directly on top of percolating networks of CNTs, the inherent roughness of the CNT network may be used to cause roughness-induced crystallization or crystalline growth in order to improve device characteristics.

One technique for sorting carbon nanotubes by their band gap, diameter, and electronic-type that is currently amenable to the fabrication of organic semiconductor-semiconducting CNT heterojunction photovoltaic solar cells is density gradient ultracentrifugation (DGU) (M. S. Arnold, A. A. Green, J. F. Hulvat et al., Nature Nanotech. 1(1), 60 (2006); M. S. Arnold, S. I. Stupp, and M. C. Hersam, Nano Letters 5 (4), 713 (2005)). Using DGU, bulk samples (gram scale) of up to 99% single electronic type (either semiconducting or metallic) can be readily produced. Furthermore, DGU can be used to sort SWNTs by their diameter, optical band gap, and electrical band gap as well.

Incorporation of a network of nanotubes into a matrix can be carried out by several methods known in the art, including but not limited to vapor deposition of the matrix material and spin-casting of polymer-nanotube blends. (See for example U.S. Pat. No. 7,341,774 the content of which is incorporated herein by reference, and references therein.)

Figure 11A:
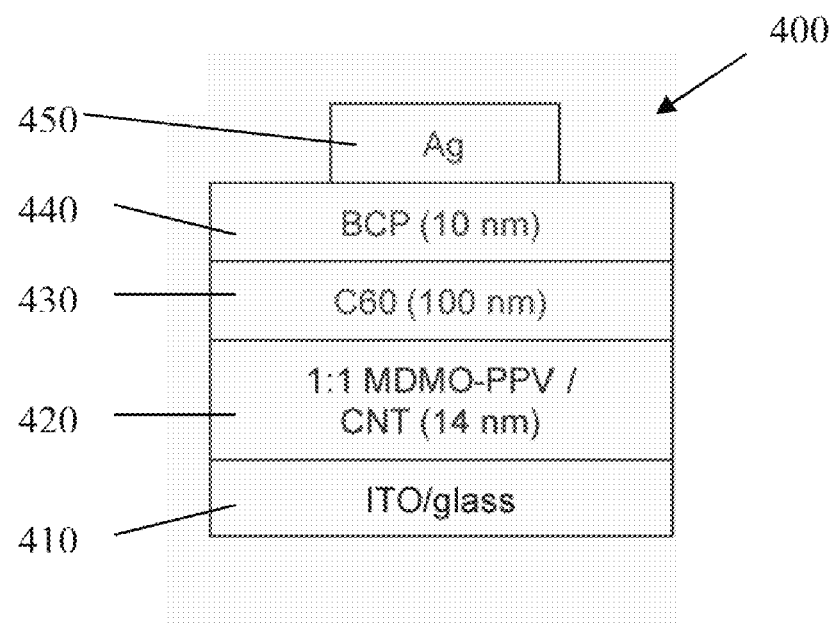
FIG. 11A shows another example of an architecture of a polymer-wrapped carbon nanotube/$C_{60}$ heterojunction diode with a 1:1 ratio of MDMO-PPV to nanotubes, by weight.

As discussed above, the properties of carbon nanotubes are influenced by the diameter of the tube and its chirality. This is illustrated in FIGS. 11A-11D where the current-voltage characteristics and spectrally resolved photoresponse for a PW-CNT/$C_{60}$ heterojunction diode 400 of FIG. 11A are shown. The diode 400 comprises an ITO anode layer 410, a PW-CNT layer 420, a $C_{60}$ acceptor layer 430, and an optional BCP exciton blocking layer 440 and a Ag cathode 450. The thickness of the layers are provided in FIG. 11A. The PW-CNT is wrapped with MDMO-PPV polymer at 1:1 ratio by weight and the PW-CNT/$C_{60}$ interface forms the heterojunction. The diode 400 has dark current rectification ratios >$10^3$ at ±1V (see FIG. 11B), which is particularly remarkable given that the PW-CNT layer 420 consists of a high density of metallic tubes whose presence would be expected to result in large shunt currents. The absence of such parasitic effects from the metal tubes suggests that they are, indeed, electrically and energetically isolated from the semiconducting tubes by the wrapped polymer.

Figure 11B:
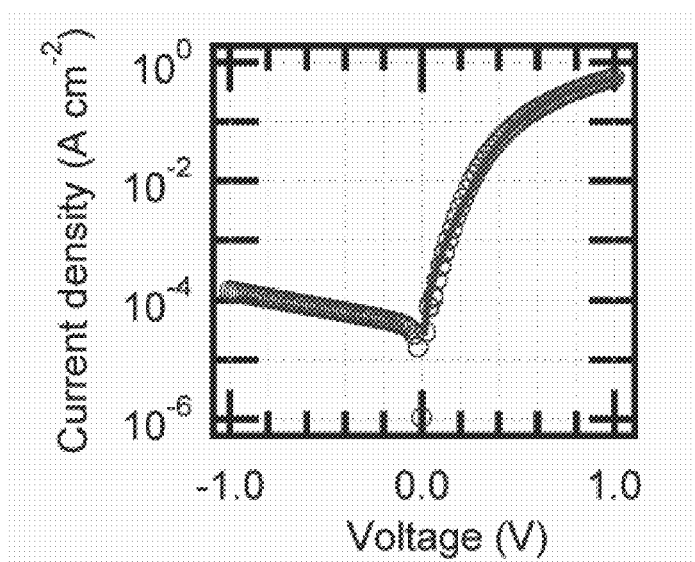
FIG. 11B shows the current-voltage characteristics of the device of FIG. 11A.

Referring to FIG. 11B, a fit to the forward bias current-voltage characteristics (solid line) follows the ideal diode equation with an ideality factor of 2.0 and a specific series resistance of 0.99 $\Omega$-cm$^2$. Here, the ideality factor ~2 suggests that carrier recombination is the dominant source of dark current, which is again remarkable considering the high density of metallic tubes which should lead to significant shunt currents (and hence resistance-limited transport).

Figure 11C:
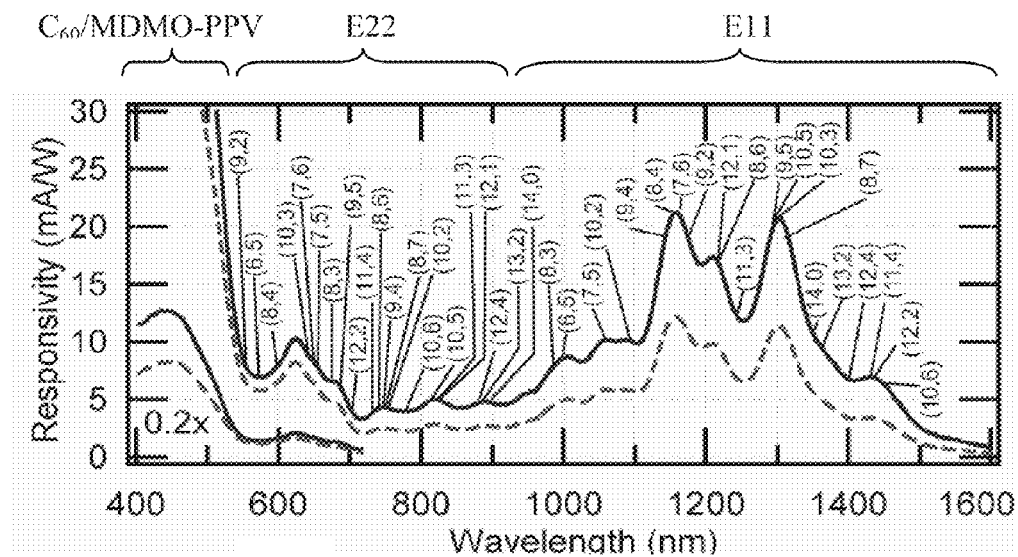
FIG. 11C shows the spectrally resolved photoresponsivity of the device of FIG. 11A.
Figure 11D:
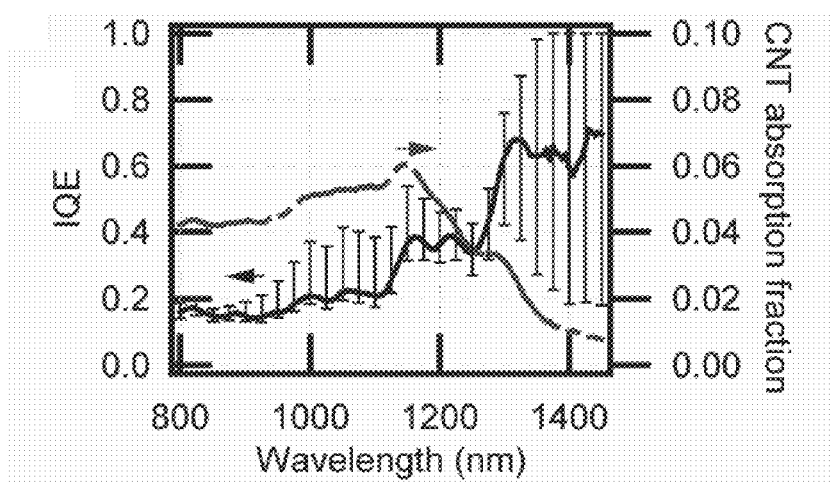
FIG. 11D shows the internal quantum efficiency (IQE) of the device of FIG. 11A and absorptivity of polymer wrapped carbon nanotubes.

The near-IR responsivities of the diode at 0 V and −0.7 V are compared in FIG. 11C. Due to the diametric heterogeneity of the nanotubes, photoactive response is observed over a wide range from both $E_{11}$ ($\lambda \approx$900-1450 nm) and $E_{22}$ ($\lambda \approx$550-900 nm) absorption features, with the peak polymer response at $\lambda$=500 nm. The chirality indices (n,m) of the nanotube responsible for each absorption feature are labeled in the FIG. 11C, as are the absorption regions of the polymer and small molecule constituents of the device. The very broad spectral coverage is a direct result of the diametric polydispersity of the SWNTs which collectively cover the spectrum from 550 nm to 1600 nm.

Referring to FIG. 11C, the diode responsivity at $\lambda$=1155 nm at a bias of 0 V and −0.7 V was 12 mA/W and 21 mA/W, respectively, corresponding to a peak EQE=2.3%. At $\lambda$=1300 nm, the detector responsivity was 11 and 21 mA/W (EQE=2.0%), respectively, whereas the response of devices lacking CNTs at these wavelengths was not measurable (<0.1 $\mu$A/W). The IQE of the SWNTs in the near-IR (FIG. 11D) was >20% between $\lambda$=1000 and $\lambda$=1400, suggesting that SWNT-based devices with much higher EQE should be achievable.

EXAMPLES

I. Materials

The method of Arnold et al., Nature Nanotech, 1:60-65 (2006) is used to isolate semiconducting CNTs using density gradient ultracentrifugation. A commercially-available CNT powder is suspended in water with a 1:4 mixture of sodium dodecyl sulfate and sodium cholate (2% surfactant) by ultrasonic treatment. The nanotube suspension is then loaded onto an iodixanol linear density gradient and centrifuged to sort the nanotubes by buoyant density. After fractionation of the density gradient, the iodixanol is removed by dialysis in surfactant solutions. Suitable organic semiconductors are well-known in the art, and are commercially available from a number of suppliers.

II. Planar Heterojunction with Near-IR Sensitivity

Raw HiPCO single-walled carbon nanotubes (from Carbon Nanotechnologies Inc.) (10 mg) having diameters in the 0.7-1.1 nm range were mixed with 10 ml of 2% (w/v) sodium cholate (Sigma-Aldrich, 995) in water. The mixture was homogenized in an ultrasonic bath for 15 minutes using a horn probe ultrasonicator. Coarse aggregates and large bundles of single-walled carbon nanotubes were then removed via ultracentrifugation (15,000 g, 12 hours). An aliquot of the resulting suspension (100 $\mu$l) was filtered via vacuum filtration on an $Al_2O_3$ membrane (0.02 $\mu$m pores, Whatman Inc.). The nanotube film was then transferred to a planar PDMS stamp by pressing the PDMS into the membrane with finger pressure. The film was then stamped (1000 N-cm-2, 60 s, room temperature, ambient atmosphere) onto a substrate consisting of 100 nm of PTCDA (3,4,9,10-perylene tetracarboxylic dianhydride) on Ag-coated ITO (indium tin oxide). The PTCDA and Ag were deposited by VTE in a 1E-7 torr vacuum at a rate of 0.15 nm/s. Testing was done in ambient, and a xenon lamp plus an AM1.5G filter was utilized to approximate the solar spectrum. A calibrated photodiode was utilized to determine the light intensity.

Figure 4:
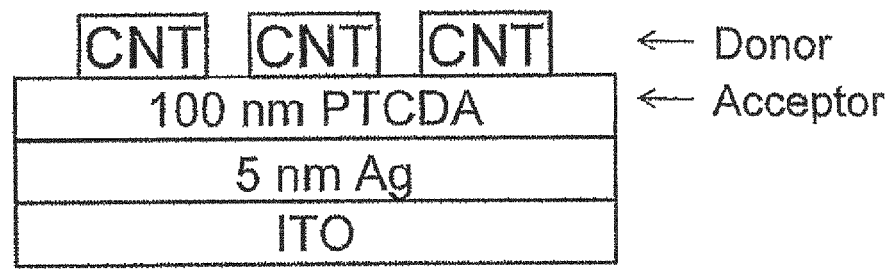
FIG. 4 shows the architecture of a planar heterojunction formed by depositing a carbon nanotube film onto PTCDA (3,4,9,10-perylene-tetracarboxyl-bis-dianhydride).
Figure 5:
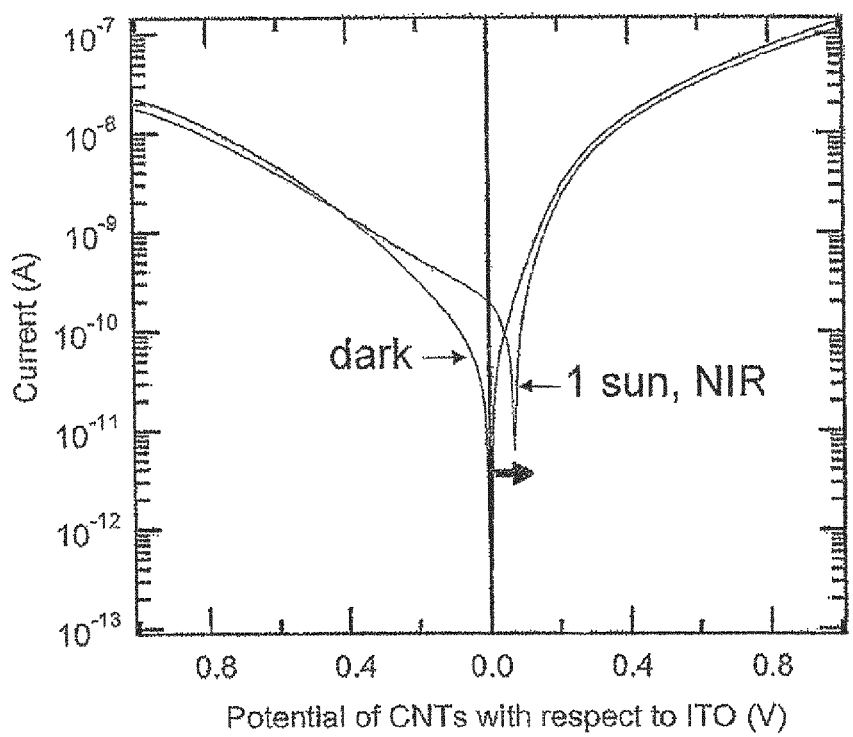
FIG. 5 shows the current-voltage curve of the heterojunction in the dark and illuminated with simulated solar near-IR radiation.

The current density-voltage curve of the resulting device (FIG. 4) was obtained by pressing a gold contact pad onto the surface of the SWNT network and applying a voltage. The potential in the x-axis of FIG. 5 denotes the potential of the carbon nanotube film with respect to that of the ITO/Ag electrode. In the dark, the device exhibited typical diode behavior, but when illuminated with simulated near-IR solar radiation (AMI 0.5G spectrum, filtered through a dielectric long-pass filter with a 950 nm cut-off) a photoelectric (i.e., photovoltaic or photodetecting) effect was observed (FIG. 5).

IV. Bulk Heterojunctions

In one embodiment, a layer of substantially semiconducting or mixed SWNTs is transferred by PDMS stamping onto a transparent anode. A suspension of substantially semiconducting SWNTs in a solution of an organic acceptor is spin-cast onto the SWNT layer. An acceptor layer, and an optional electron transport and/or exciton blocking layer, are then deposited, followed by a cathode layer.

In another embodiment, an organic donor layer is deposited onto an anode substrate, and a suspension of substantially semiconducting SWNTs in a solution of an organic acceptor is spin-cast onto the donor layer. A layer of substantially semiconducting or mixed SWNTs is applied by PDMS stamping, followed by deposition of an optional electron transport and/or exciton blocking layer. A cathode layer is then deposited.

As discussed above, excitons in carbon nanotubes can be split by interfacing them with the organic acceptor, $C_{60}$, and internal quantum efficiency as large as about 44% at 1150 nm has been observed. (See FIG. 9D). It is expected that the spectral range of the carbon nanotube/organic hybrid photovoltaic devices can further extend into the near-IR by using carbon nanotubes with larger diameter.

According to another embodiment of the present disclosure, the near-IR performance of the photovoltaic device having a PW-CNT-based photoactive region disclosed herein can be further improved. For one, the optical field can be managed and enhance the absorption in the PW-CNT-based photoactive region and reduce the absorption in the ITO anode. This is beneficial because ITO is generally partially absorbing in the near-IR range (>1000 nm). The photovoltaic device's sensitivity at different wavelengths can be modified by depositing a thin buffer layer of $C_{60}$ acceptor of about 35 nm. The thin buffer layer of $C_{60}$ acceptor layer eliminates possible shorting contact between the CNTs and the metal Ag cathode contact, thus, reducing dark (leakage) current. Additionally, by changing the thickness of the $C_{60}$ the optical field can be modified by changing the distance between the Ag cathode and the PW-CNT-based photoactive region. Thus, the thickness of the $C_{60}$ determines if the thin layer of PW-CNTs is at an optical maximum minimum or somewhere in between.

Because the PW-CNT-based photoactive region and the ITO both absorb in the near-IR and are very close to each other, the thickness of the $C_{60}$ layer is controlled to have the optical field maximum lie in the PW-CNT layer or $C_{60}$ rather than in the ITO. The inventors have found that for the HiPCO CNTs having diameters in the range of 0.7-1.1 nm, 100-150 nm is the ideal $C_{60}$ thickness to have the near-IR optical field maximum lie in the PW-CNT layer. This will change depending on what wavelength is being targeted.

A thicker layer of $C_{60}$ places the optical field in the PW-CNT layer instead of the ITO. Referring to the generic architecture of PW-CNT-based photovoltaic device 90 shown in FIG. 9A, the $C_{60}$ acceptor layer 93 is preferably about 100 to 140 nm thick to move the peak in the near-IR optical field into the PW-CNT-based photoactive layer 92. The FIGS. 12A-12D show calculated optical field plots for simulated photovoltaic device structures having four different $C_{60}$ thicknesses. In all four simulated structures, the ITO layer is 140 nm thick, the PW-CNT-based photoactive layer is 50 nm thick, the BCP exciton blocking layer is 10 nm thick and the Ag cathode layer is 100 nm thick. The $C_{60}$ layer thicknesses are 35 nm (FIG. 12A), 70 nm (FIG. 12B), 105 nm (FIG. 12C) and 140 nm (FIG. 12D). The vertical dashed lines in FIGS. 12A-12D indicate the division between the layers of ITO, PW-CNT-based photoactive layer, $C_{60}$/BCP, and the Ag cathode contact. The intensity of the near-IR optical field is shown to be in the ITO for 35 nm $C_{60}$ but primarily in the PW-CNT-based photoactive layer for 104 nm and 140 nm.

Figure 13:
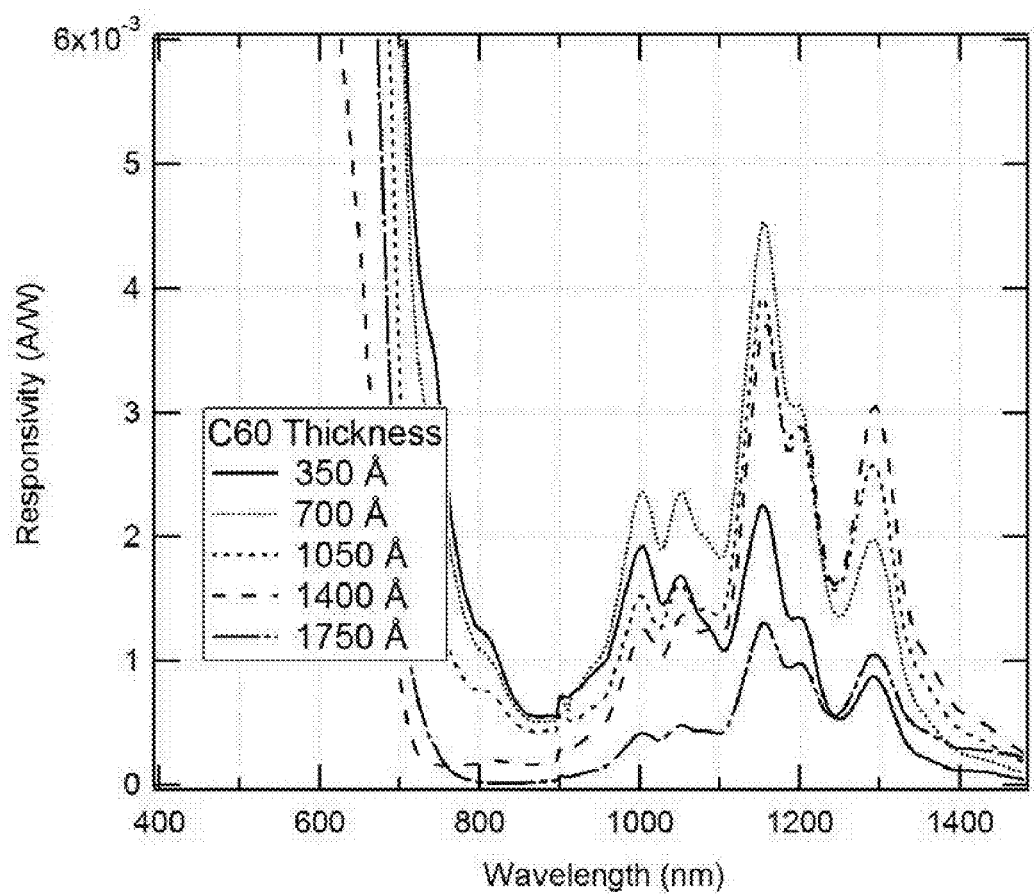
FIG. 13 shows the responsivity plot for the photovoltaic device structure of FIG. 9A for different $C_{60}$ thicknesses.

FIG. 13 shows the responsivity of the photovoltaic device 90 with different thicknesses of the $C_{60}$ acceptor. The responsivity is increased for $C_{60}$ thicknesses of 70 nm, 105 nm and 140 nm, correlating with the optical field plots of FIGS. 12A-12D. The highest EQE at longer wavelengths is observed for thicknesses of 100 or 140 nm of $C_{60}$ which correlates to FIGS. 12A-12D. In the illustrated example, $C_{60}$ is used as the acceptor material with respect to the PW-CNT-based photoactive layer, but other organic materials having a suitable LUMO level similar to $C_{60}$ can be used. Some examples are PTCBI (3,4,9,10 perylenetetracarboxylic bisbenzimidazole) having a LUMO of −4.0 eV; [84]PCBM ([6,6]-Phenyl $C_{84}$ butyric acid methyl ester) having a LUMO of −4.1 eV; $F_{16}$-CuPc having a LUMO of −4.4 eV; PTCBI (3,4,9,10 perylenetetracarboxylic bisbenzimidazole) having a LUMO of −4.0 eV; PTCDA (3,4,9,10 perylene-tetracarboxylic dianhydride) having a LUMO of −4.7 eV; Poly(benzimidazobenzo phenanthroline) having a LUMO of −4.5 eV; TCNQ (7,7,8,8-tetracyanoquinodimethane) having a LUMO of 3.9 eV; and the like.

Regardless of the thickness of the $C_{60}$ acceptor layer 93 used, a hole in the responsivity of the PW-CNT-based photoactive layer 92 between roughly 700 nm and 1000 nm range needs to be improved. This hole in the responsivity is shown in FIG. 11C, where the spectrally resolved photoresponse for a PW-CNT/$C_{60}$ heterojunction diode 400 of FIG. 11A is shown. Referring to FIG. 13, the responsivity in the $E_{22}$ range (λ≈550-900 nm) is noted as being considerably lower than that in the $E_{11}$ range (λ≈900-1450 nm), partially due to reduced absorptivity of the $E_{22}$ peaks. The hole is caused by a lack of absorption due to the reduced number of nanotubes with $E_{11}$ or $E_{22}$ transitions in this energy range creating a region with reduced responsivity and detectivity. This hole in the responsivity between 700 and 1000 nm is not due to optical field. For all thicknesses of $C_{60}$, we see a low responsivity around ~900 nm, even when the optical field should be large at those wavelengths (i.e. 35 nm or 70 nm of $C_{60}$)

The hole, the region of reduced responsivity of the PW-CNT-based photoactive layer 92, can be filled by providing an additional layer of organic photoactive material between the PW-CNT based donor layer and the acceptor layer wherein the additional organic photoactive material can serve as a second donor material relative to the acceptor material and/or a second acceptor relative to the PW-CNT based donor material in the photoactive device. This additional organic photoactive material can be a small molecule material or a polymer that has the appropriate energy levels and absorption in the wavelength range where the hole in the responsivity of the PW-CNT based photoactive layer 92 exists. In a preferred embodiment, the additional organic photoactive material layer can be a small molecule material or a polymer that preferably has an absorption coefficient of at least $5\times10^4$ cm$^{-1}$ across a wavelength band from 600 nm to 900 nm. Each of the first donor material layer (i.e. the PW-CNT based donor material), the additional organic photoactive material layer, and the acceptor material layer may have a different absorption spectra.

Figure 14A:
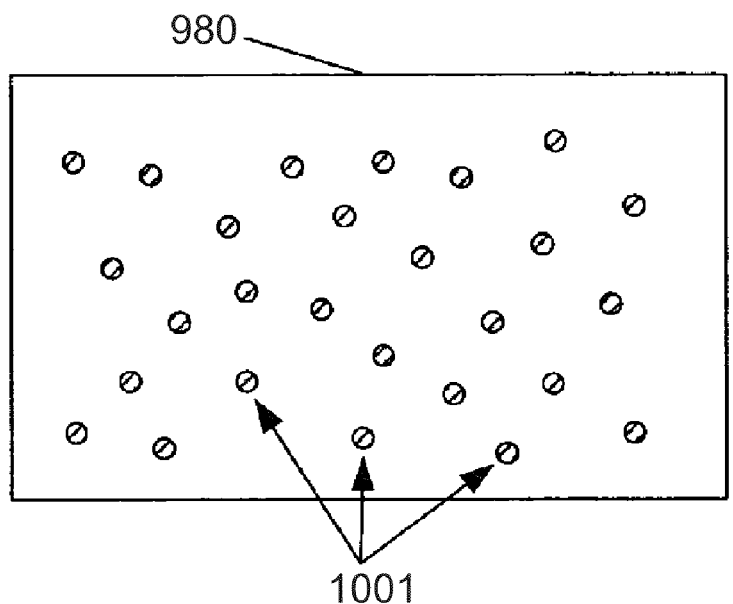
FIG. 14A illustrates a plan view of an example of the additional organic photoactive material layer provided between the CNT based donor layer and the acceptor layer.
Figure 14B:
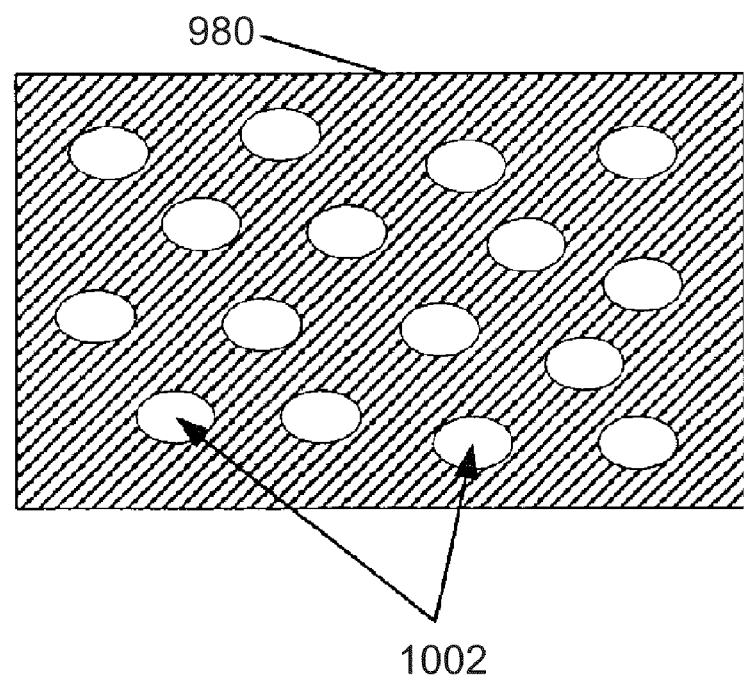
FIG. 14B illustrates a plan view of another example of the additional organic photoactive material layer provided between the CNT based donor layer and the acceptor layer.

In a preferred embodiment shown in FIG. 14A, the additional layer 980 of organic photoactive material between the PW-CNT based donor layer and the $C_{60}$ acceptor layer can be provided as a unitary layer having openings 1001 there through. In that embodiment, the PW-CNT based donor layer is in direct contact with the $C_{60}$ acceptor layer through the openings 1001. Alternatively, the additional layer 980 of organic photoactive material between the PW-CNT based donor layer and the $C_{60}$ acceptor layer can be provided as a discontinuous layer having a plurality of islands 1002 comprising the additional organic photoactive material. In which case, the PW-CNT based donor layer is in direct contact with the $C_{60}$ acceptor layer in-between the islands 1002. In either case, the additional layer of organic photoactive material forms additional (the new organic photoactive material)/$C_{60}$ donor-acceptor heterojunction in addition to the PW-CNTs/$C_{60}$ donor-acceptor heterojunction.

Additionally, the morphology of the additional organic photoactive material layer can be a combination of the two types described. In other words, the additional layer of organic photoactive material can have a region or regions that are unitary layer having openings there through and also have a discontinues region or regions having a plurality of islands. Furthermore, the additional organic photoactive material layer can comprise a mixture of a second donor material and the $C_{60}$ acceptor material. The two material can be mixed at the molecular level and/or mixed in small aggregates as the two materials are co-deposited to provide a bulk heterojunction region to enhance dissociation of the excitons. An example of a method for forming a bulk heterojunction by OVPD is described in United States patent application publication No. 2008/0116536 published on May 22, 2008 the disclosure of which is incorporated herein by reference in its entirety.

Figure 15A:
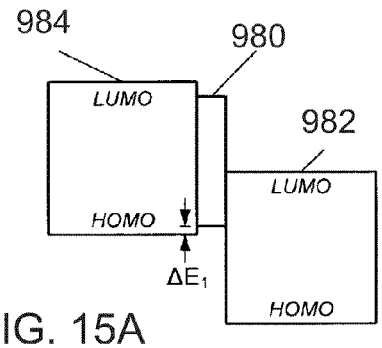
FIG. 15A illustrates an energy level diagram including the additional organic photoactive material layer as a donor.

Referring to the energy diagram of FIG. 15A, in an embodiment where the additional organic photoactive material layer 980 is serving as a donor relative to the $C_{60}$ acceptor layer 982, the HOMO of the additional organic photoactive material is preferably no more than 0.16 eV above a HOMO of the PW-CNT based donor material (shown as $\Delta E_1$), and the band gap of the additional organic photoactive material is preferably less than the band gap of the PW-CNT based donor material 984. The additional organic photoactive material may have a hole mobility of less than $1\times10^{-9}$ cm$^2$/Vs.

Figure 15B:
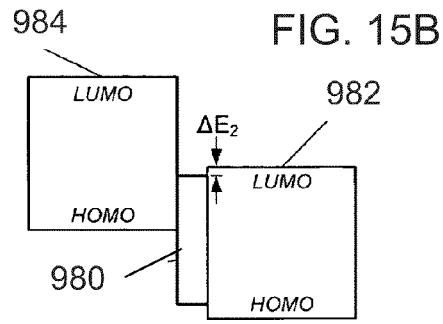
FIG. 15B illustrates an energy level diagram including the additional organic photoactive material layer as an acceptor.

Referring to the energy diagram of FIG. 15B, in an embodiment where the additional organic photoactive material layer 980 is serving as an acceptor relative to the PW-CNT based donor layer 984, the LUMO of the additional organic photoactive material is preferably no more than 0.16 eV below the LUMO of the $C_{60}$ acceptor (shown as $\Delta E_2$), and the band gap of the additional organic photoactive material is preferably less than the band gap of the $C_{60}$ acceptor material 982.

Figure 15C:
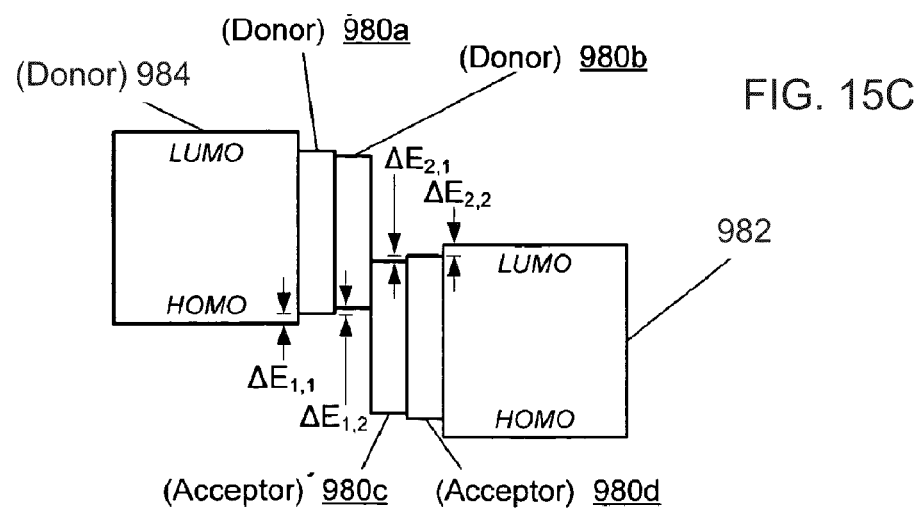
FIG. 15C illustrates an energy level diagram including the one or more additional organic photoactive material layers.

Referring to the energy diagram of FIG. 15C, in another embodiment, a plurality of additional organic photoactive material layers (980a, 980b, 980c, 980d, for example) can be provided between the PW-CNT based donor layer 984 and the acceptor layer 982. In this example, the layers 980a and 980b represent the first and second additional organic photoactive material layers serving as donors relative to the acceptor 982 and the layers 980c and 980d represent the third and fourth additional organic photoactive material layers serving as acceptors relative to the PW-CNT based donor 984. Preferably, to avoid charge carrier trapping: the HOMO of the first additional organic photoactive donor layer 980a is no more than 5 kT above the HOMO of the PW-CNT based donor layer 984 (shown by $\Delta E_{1,1}$); the HOMO of the second additional organic photoactive donor layer 980b is no more than 5 kT above the HOMO of the first additional organic photoactive donor layer 980a (shown by $\Delta E_{1,2}$); the LUMO of the third additional photoactive acceptor layer 980c is no more than 5 kT below the LUMO of the fourth additional photoactive acceptor layer 980d (shown by $\Delta E_{2,1}$); and the LUMO of the fourth additional photoactive acceptor layer 980d is no more than 5 kT below the LUMO of the acceptor layer 982 (shown by $\Delta E_{2,2}$).

Examples of small molecule material for the additional organic photoactive material layer 980 that can serve as a donor relative to the $C_{60}$ acceptor include tin (II) phthalocyanine (SnPc) and lead phthalocyanine (PbPc). For example, it has been shown that SnPc can extend the spectral response across this wavelength region (600 nm to 900 nm) through a combination of monomer and aggregate absorption, with rapid and efficient exciton dissociation at the SnPc/$C_{60}$ interface. See Yang, F., Lunt, R. R., and Forrest, S. R., *Simultaneous heterojunction organic solar cells with broad spectral sensitivity*, APPL. PHYS. LETT. 92(5) (2008) the disclosure of which is incorporated herein by reference.

Figure 16A:
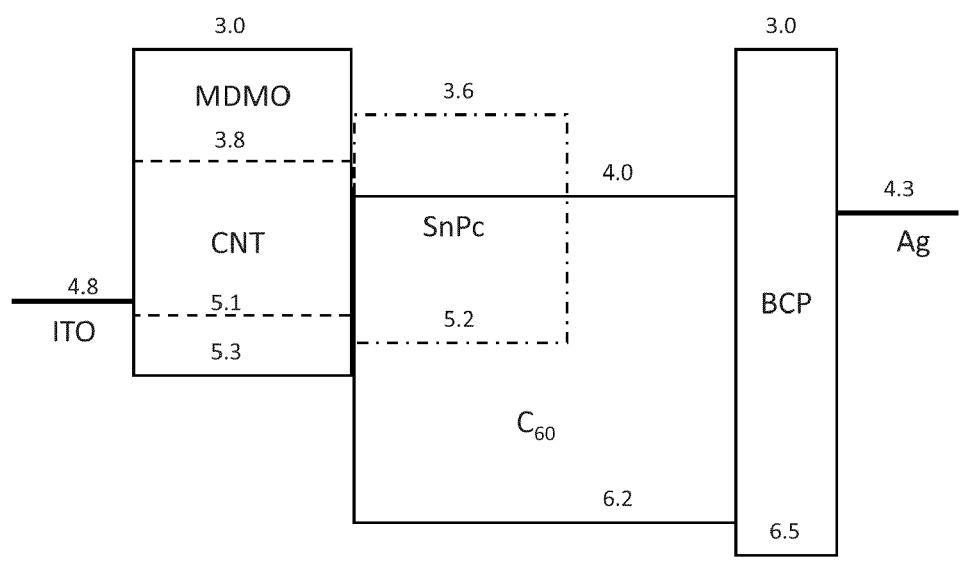
FIG. 16A is energy level diagram for the various materials, MDMO, CNT, SnPc and $C_{60}$, comprising a photovoltaic device according to an embodiment of the present disclosure.

As shown in the energy level diagram FIG. 16A, for a photoactive device according to an embodiment of the present disclosure, SnPc is a suitable additional organic photoactive material that serve as a donor relative to the $C_{60}$ acceptor because the HOMO levels nearly align with the CNTs in the donor layer and the SnPc layer can be grown with a desired morphology discussed above, i.e. forming a unitary layer having a plurality of openings and/or a discontinuous layer comprising islands of SnPc. The SnPc can be deposited on a surface by OVPD, VTE, inkjet printing, vaporjet printing, doctor blading, or other suitable methods. This allows the acceptor $C_{60}$ to be overgrown and responsivity from both PW-CNTs/$C_{60}$ donor-acceptor heterojunction interface and SnPc/$C_{60}$ donor-acceptor heterojunction interface is observed. The SnPc layer provides an absorption peak at 900 nm associated with dimers of SnPc. Alternatively, the SnPc can be co-deposited with $C_{60}$ to create a peak at 750 nm that is associated with absorptions from monomers of the SnPc.

Figure 16B:
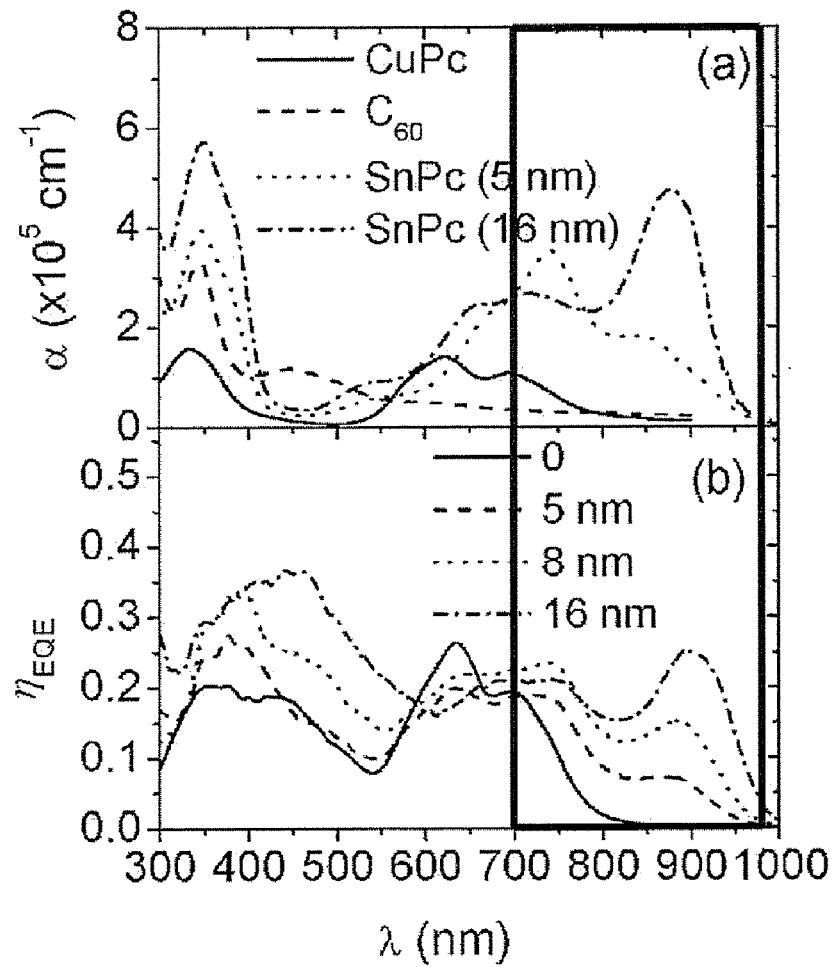
FIG. 16B is a plot showing absorption coefficients of CuPc, $C_{60}$ and SnPc films grown on fused quartz substrates and external quantum efficiency of ITO/CuPc/SnPc/$C_{60}$/BCP/Ag solar cells for two different SnPc thicknesses.

FIG. 16B shows (a) absorption coefficients α of CuPc, $C_{60}$, and SnPc films grown on fused quartz substrates; and (b) external quantum efficiency (EQE), $\eta_{EQE}$ of ITO/CuPc (15 nm)/SnPc($t_{SnPc}$)/$C_{60}$ (40 nm)/BCP/Ag solar cells for different SnPc thicknesses in the spectrum range of interest, 700-1000 nm.

Figure 17A:
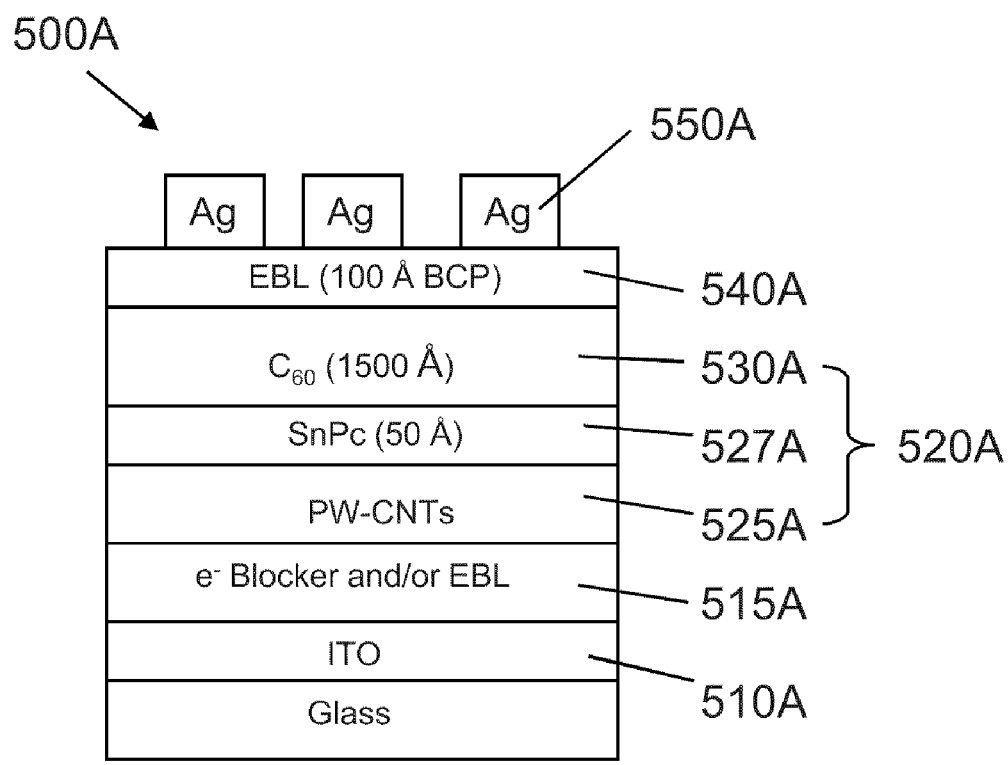
FIG. 17A shows the photoactive device architecture according to an embodiment.

FIG. 17A shows the improved photoactive device architecture 500A according to an embodiment of the present disclosure incorporating a neat layer 527A of SnPc as the additional organic photoactive material layer that serves as a donor relative to the acceptor. The photoactive device 500A comprises an anode layer 510A, cathode contacts 550A and a photoactive region 520A disposed between and electrically connected to the anode layer 510A and the cathode contacts 550A. In a preferred embodiment, the anode layer 510A is formed from a transparent metal substitutes such as ITO and the cathode contacts 550A are formed from Ag.

The photoactive region 520A comprises a first donor material layer 525A formed over the ITO layer 510A and an acceptor material layer 530A formed over the first donor material layer 525A. The first donor material layer 525A comprises a PW-CNT containing material. A thin layer 527A of SnPc (5 nm thick) that serves as the second donor material relative to the acceptor material layer 530A is disposed between the first donor material layer 525A and the acceptor material layer 530A. The SnPc second donor material layer 527A in this embodiment, as discussed above, is either a discontinuous layer comprising islands and/or a unitary layer having a plurality of openings that allows direct contact between the PW-CNTs in the first donor material layer 525A and the acceptor material layer 530A, thus, forming two parallel donor-acceptor heterojunction interfaces. Preferably, the acceptor material layer 530A is formed from $C_{60}$ having a thickness of about 100-150 nm. Preferably, the acceptor material layer 530A is a 150 nm thick layer of $C_{60}$. $C_{60}$ can be deposited by OVPD, VTE, inkjet printing, vaporjet printing, doctor blading or other suitable methods. In a preferred embodiment, $C_{60}$ is deposited by VTE.

The PW-CNT containing material layer 525A can be formed by placing HiPCO CNTs (0.1% wt./vol.) into a solution of wrapping polymer, MDMO-PPV (0.312% wt./vol.), in chlorobenzene solvent and then separating the CNTs using a high-power horn sonicator (for 30 minutes) and centrifuged at 14,000 g for 5 hrs to remove the bundles, agglomerates, and catalyst particles. The PW-CNTs are then solubilized in PCBM (1.2% wt./vol.) and spread over a hot ITO-coated glass substrate via doctor-blading in an inert nitrogen atmosphere.

Figure 17B:
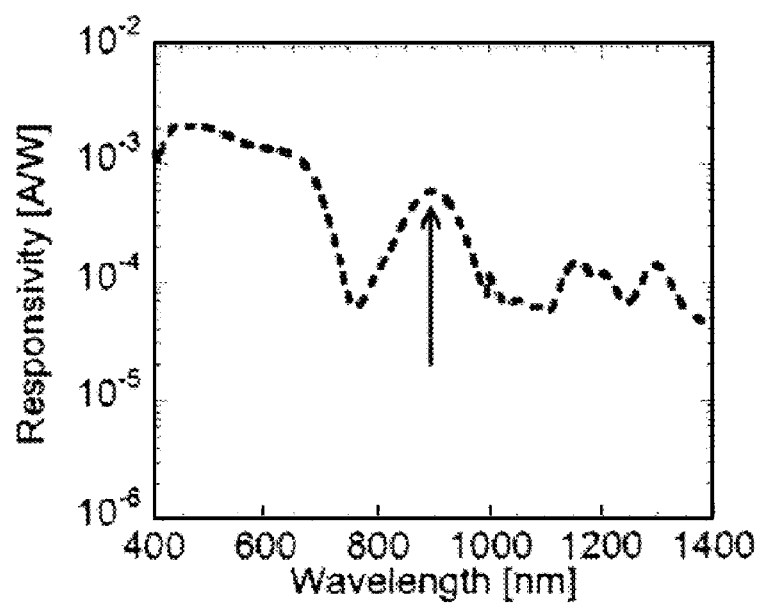
FIGS. 17B and 17C show plots of responsivity and specific detectivity of the photoactive device of FIG. 17A.
Figure 17C:
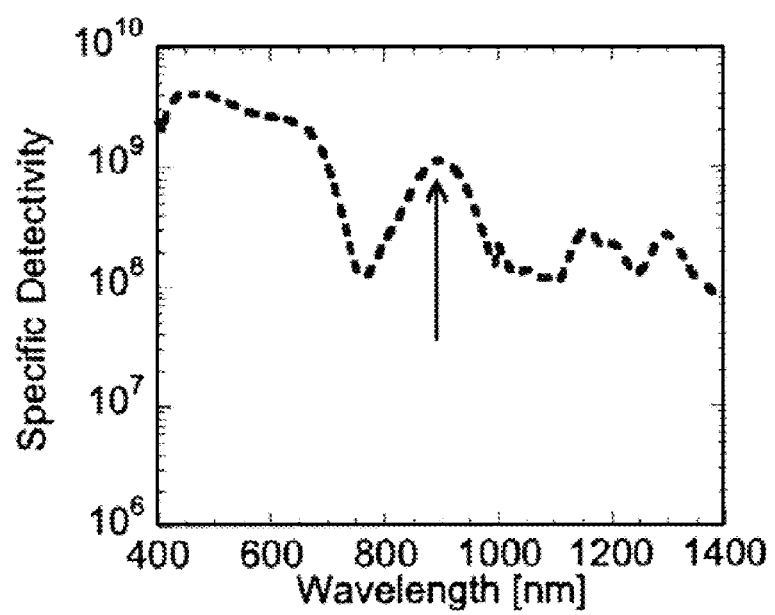

FIGS. 17B and 17C show plots of responsivity and specific detectivity, D*, of the photoactive device 500A, respectively. The peaks at 900 nm associated with SnPc dimer are identified in each plot. Specific detectivity, D*, was calculated using $$D^* = \frac{\Re \cdot \sqrt{A}}{S_N}$$

[$cm \cdot Hz^{1/2} \cdot W^{-1}$], where $\Re$ is the device responsivity in Amps/Watt, A is the area in $cm^2$, and $S_N$ is the current spectral noise density in $A \cdot Hz^{-1/2}$, where $S_N^2$ is the sum of all noise powers (e.g. thermal, shot, and excess noise). Under zero bias, the thermal (Johnson-Nyquist) noise dominates, giving $S_T = \sqrt{4k_B T/R_D}$ [$A \cdot Hz^{-1/2}$], where $k_B$ is the Boltzmann constant, T is temperature, and $R_D$ is the zero-bias differential resistance of the diode.

Figure 18A:
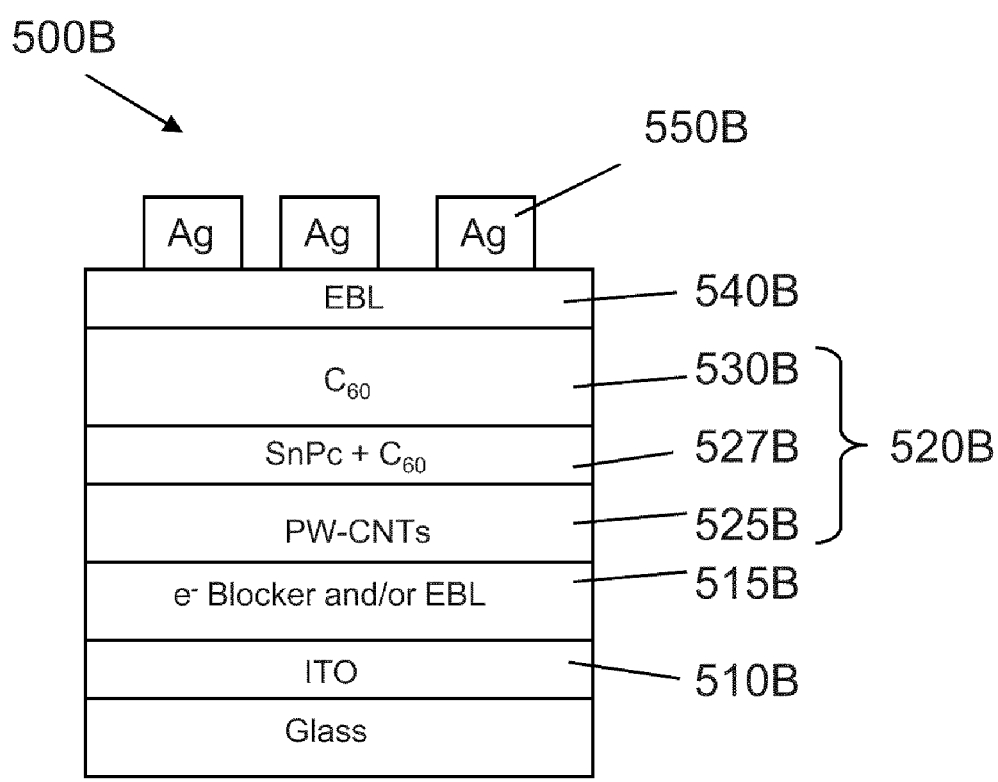
FIG. 18A shows the photoactive device architecture according to another embodiment.

FIG. 18A shows the improved photoactive device architecture 500B according to another embodiment in which an additional organic photoactive material layer 527B comprises a second donor material and the acceptor material, $C_{60}$, that are co-deposited. The photoactive device 500B comprises ITO anode layer 510B, an optional EBL 515B formed over the ITO anode layer 510B, a photoactive region 520B formed over the EBL 515B, an optional EBL 540B (10 nm thick) formed over the photoactive region 520B, and Ag cathode contacts 550B. The EBL 540B can be made of BCP material.

The photoactive region 520B comprises a first donor material layer 525B formed over the ITO layer 510B, and an acceptor material layer 530B (about 100-150 nm of $C_{60}$) formed over the first donor material layer 525B. The first donor material layer 525B comprises a PW-CNT containing material. Disposed between the PW-CNT containing material layer 525B and the acceptor material layer 530B is the additional organic photoactive material layer 527B that is formed by co-depositing a second donor material with the acceptor material. In this example, the second donor material is SnPc and the acceptor material is $C_{60}$ and the resulting layer 527B is about 10 nm thick.

The co-deposited SnPc+$C_{60}$ layer 527B is not a homogeneous mixture of the two materials and SnPc and $C_{60}$ form a bulk heterojunction, such that there is favorably a large volume over which exciton dissociation can occur. However, such a layer may have lower conductivity than a pure donor material layer or a pure acceptor material layer, and lower conductivity is undesirable for promoting the photocurrent in the photoactive device. The conductivity issues are aggravated by thicker layers, so there is a limit on the thickness that such a donor+acceptor layer may have if a reasonable conductivity is desired.

The co-deposited SnPc+$C_{60}$ layer 527B provides a spatially distributed donor-acceptor interface that is accessible to all or most of the photogenerated exciton generated in the additional organic photoactive material layer. The bulk heterojunction formed in the co-deposited SnPc+$C_{60}$ layer 527B can have multiple donor-acceptor interfaces as a result of having plural domains of the two materials. Some domains may be surrounded by the opposite-type material (e.g., a domain of the second donor material surrounded by acceptor material or a domain of the acceptor material surrounded by the second donor material) and may be electrically isolated, such that these domains do not contribute to photocurrent. However, there are sufficient number of domains that are connected by percolation pathways (continuous photocurrent pathways formed by domains of each of the two materials), such that these other domains contribute to the photocurrent. The domains of SnPc provide percolating pathways for hole transport and the domains of $C_{60}$ provide percolating pathways for electron transport. Therefore, a preferred microstructure for the additional organic photoactive material layer 527B includes percolating pathways for hole and electron transport through the additional organic photoactive material layer 527B. Preferably, the width of the path is 5 molecules wide or less, and more preferably 3 molecules wide or less. Photogenerated charges may be efficiently transported along such paths to their respective electrodes without significant recombination with their countercharges. The co-deposited donor and acceptor materials form spatially distributed donor-acceptor interfaces for efficient exciton diffusion and subsequent dissociation.

The $C_{60}$ in the co-deposited SnPc+$C_{60}$ layer 527B provides a continuous percolation pathways from the PW-CNT containing first donor material layer 525B to the $C_{60}$ in the acceptor material layer 530B, thus, forming two parallel heterojunctions: (1) the bulk heterojunction formed in the co-deposited SnPc+$C_{60}$ layer 527B, and (2) the heterojunction formed between the PW-CNT containing first donor material layer 525B and the $C_{60}$ in the layers 527B and 530B. Preferably, the acceptor material layer 530B is a 150 nm thick layer of $C_{60}$.

The result is that in both embodiments 500A and 500B, the first donor material (PW-CNT) comes in direct contact with the acceptor material $C_{60}$ at the interface between the first donor material layers 525A, 525B and the additional organic photoactive material layers 527A, 527B. In both embodiments, the PW-CNTs make contact with $C_{60}$ between regions or domains of the SnPc material.

The additional organic photoactive material layer 527B is formed by co-depositing the near-IR absorbing SnPc and $C_{60}$ over the PW-CNT containing layer 525B. The SnPc and $C_{60}$ can be co-deposited by VTE, OVPD, inkjet printing, vaporjet printing, solution processing or other suitable method. In one preferred embodiment, the SnPc and $C_{60}$ materials are co-deposited in a 1:3 (by volume, 10 nm total thickness) mixture by VTE. According to another embodiment, if the acceptor material layer 530B is formed from a suitable acceptor material other than $C_{60}$, the SnPc containing additional organic photoactive material layer 527B would then be formed by co-depositing SnPc with that acceptor material.

Figure 18B:
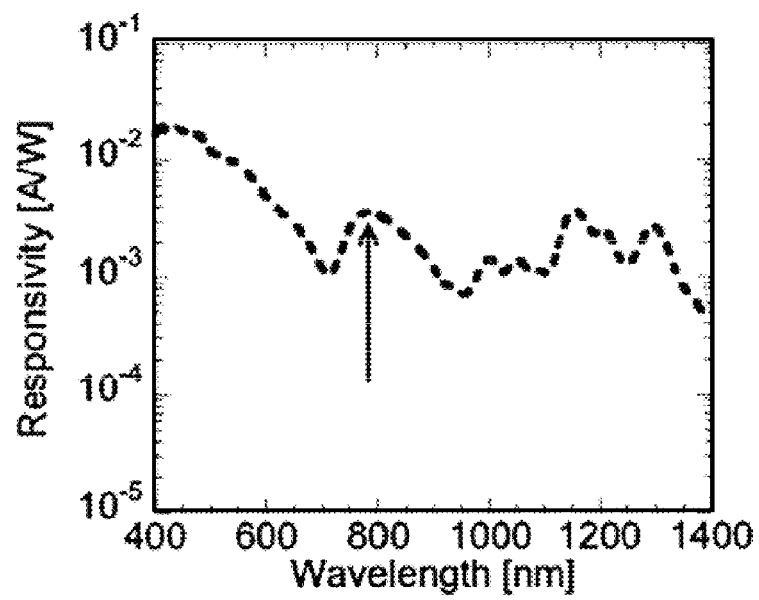
FIGS. 18B and 18C show plots of responsivity and specific detectivity of the photoactive device of FIG. 18A.
Figure 18C:
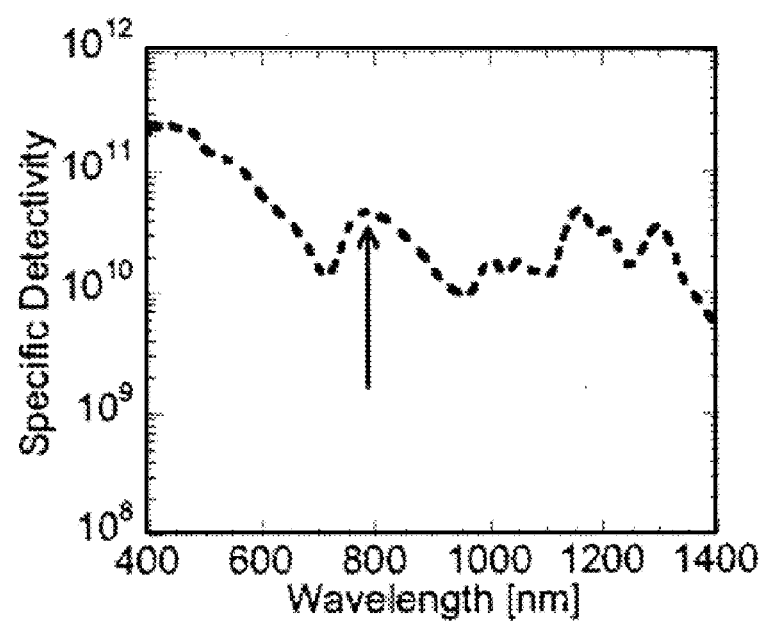

FIGS. 18B and 18C show plots of responsivity and specific detectivity of the photoactive device 500B, respectively. The peaks at 750 nm associated with SnPc monomer are identified in each plot.

As discussed above, other suitable acceptor materials such as $F_{16}$-CuPc or PTCBI that have the similar LUMO levels as $C_{60}$ and appropriate absorption at these wavelengths also can be used in place of $C_{60}$.

Consistent with the various embodiments discussed in the present disclosure, an organic photoactive layer comprising a second donor material, such as SnPc or PbPc, can be provided between the acceptor layer and the PW-CNT containing bulk heterojunction layers in the embodiments shown in FIGS. 2A and 3A.

In one preferred embodiment, optional EBLs can be provided between the photoactive regions 520A, 520B and their respective electrodes 510A, 550A (anodes) and 510B, 550B (cathodes). For example, in the photoactive device 500A, a first optional EBL 515A can be provided between the anode 510A and the donor material layer 525A and a second optional EBL 540A can be provided between the cathode contacts 550A and the acceptor material layer 530A. The EBLs 540A, 540B provided on the cathode side are formed from a material, such as BCP, having an appropriate HOMO-LUMO energy gap relative to the acceptor material layer 530A, 530B to function as an EBL as well as a hole blocker.

Figure 19A:
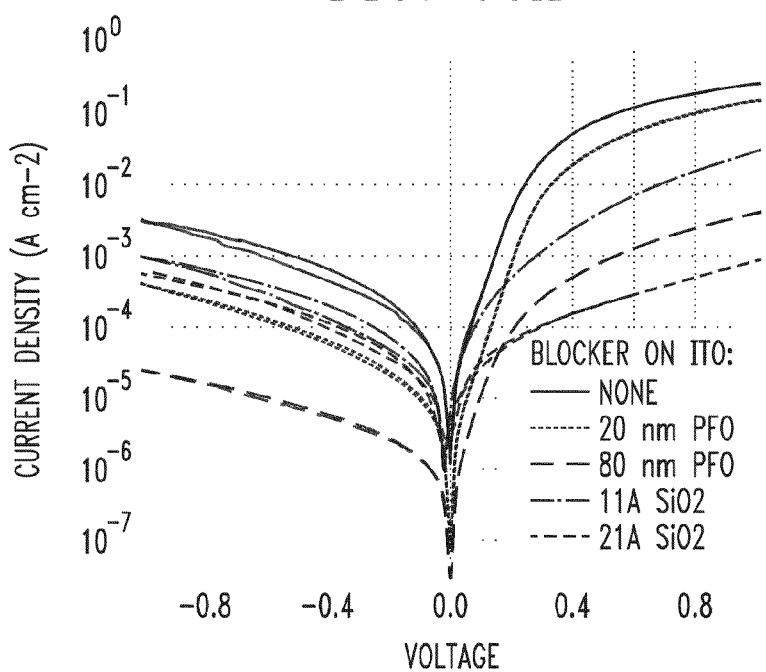
FIG. 19A is a current-voltage plot showing the effect of $SiO_2$ and PFO as the electron blocking layer.
Figure 19B:
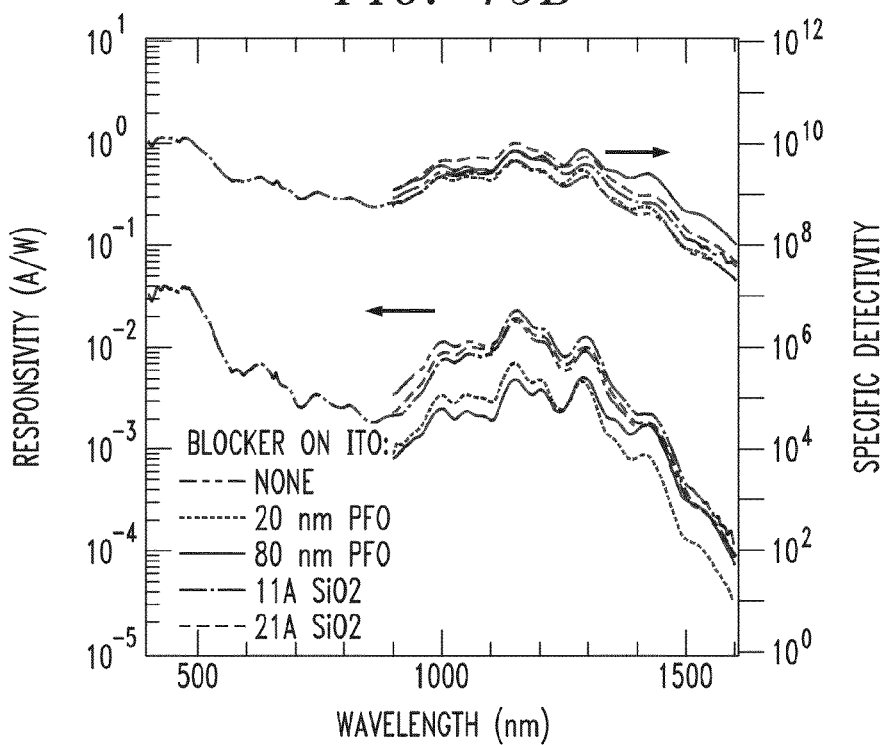
FIG. 19B is a plot of the responsivity and specific detectivity showing the effect of $SiO_2$ and PFO as the electron blocking layer.

The purpose of the EBL on the anode side is to prevent excitons from quenching onto the ITO anode layer and to prevent electron transport between the ITO and the PW-CNTs. Ideally, the ITO-CNT interface would only have hole transport between the CNT valence band and the ITO. But the barrier to electron transport between the conduction band of the CNT and the ITO is small. In a preferred embodiment, the EBLs 515A, 515B provided on the anode side are formed from a material having an appropriate HOMO-LUMO energy gap relative to the donor material layers 525A, 525B to function as an EBL as well as an electron blocker to reduce dark current and thus increase the specific detectivity of the PW-CNT-based photoactive devices 500A and 500B. Such electron blocking EBLs can be formed from a number of materials such as $SiO_2$, PFO, or NiO and more preferably from NiO because NiO has a wide band gap of 3.5 eV and a valence band energy of ~5.4 eV. The work function is around 5 eV placing it at a similar energy to the CNT valence band making hole transport easy while preventing electron transport. This will reduce dark current and increase the detectivity of the device and improves device stability. FIG. 19A shows the effect of $SiO_2$ and PFO as the electron blocking layer materials on current-voltage curves. FIG. 19B shows the responsivity and specific detectivity. The electron blocking layers generally reduce the responsivity, but the decrease in dark current is sufficient to increase the specific detectivity. Therefore, in the embodiments of the photoactive devices described herein, where an EBL is provided on the anode side of the device, the EBL layer is interchangeable with an electron blocking EBL or an electron blocking layer that may not block excitons.

Figure 21A:
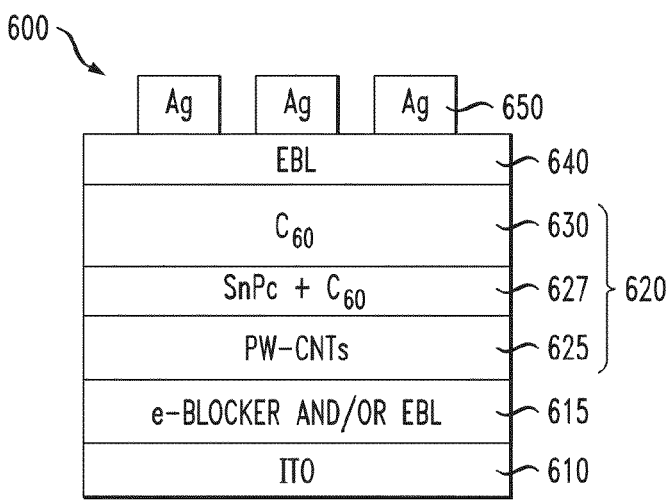
FIG. 21A shows the photoactive device architecture according to another embodiment.

Referring to FIG. 21A, the improved photoactive device 600 having an architecture according to another embodiment is shown. The photoactive device 600 comprises an ITO anode layer 610, an optional electron blocking EBL 615 formed over the ITO anode layer 610, a photoactive region 620 formed over the electron blocking EBL 615, an optional BCP exciton blocking layer 640 (10 nm thick) formed over the photoactive region 620, and Ag cathode contacts 650.

Figure 21B:
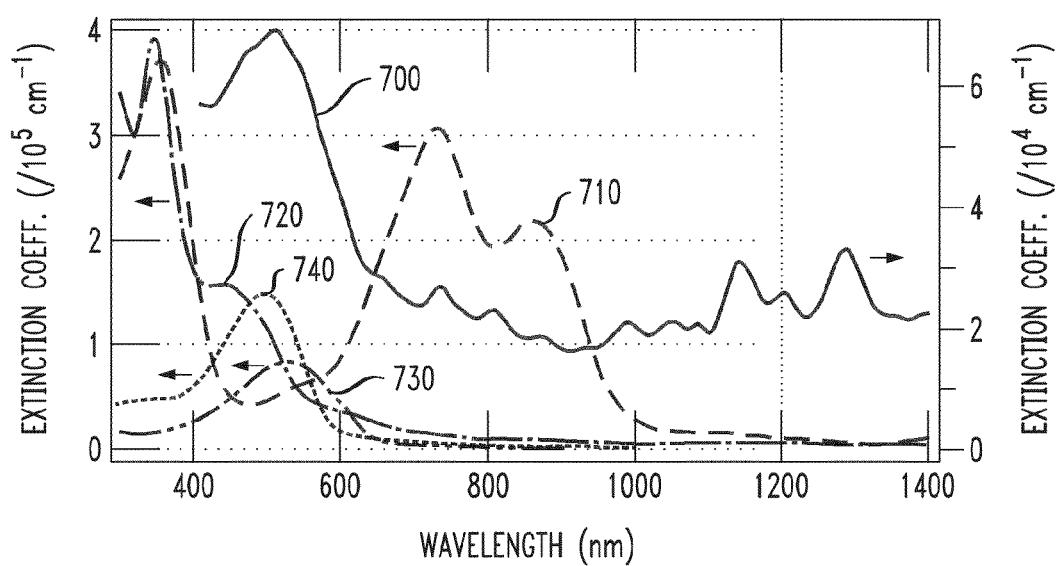
FIG. 21B shows the extinction coefficients for certain materials.

The photoactive region 620 comprises a donor material layer formed over the ITO anode material layer 610 and an acceptor material layer 630 formed over the donor material layer. As in the photoactive device 500B, the donor material layer comprises a PW-CNT containing layer 625 and an additional organic photoactive material layer 627 disposed between the PW-CNT containing layer 625 and the acceptor material $C_{60}$ layer 630. The additional organic photoactive material layer 627 comprises both SnPc and $C_{60}$ materials formed by co-depositing them into a 10 nm thick film. The acceptor material layer 630 is formed from $C_{60}$ and is about 100-150 nm thick. As in the photoactive device 500B, two parallel heterojunctions are formed: (1) the bulk heterojunction formed by the SnPc and $C_{60}$ in the additional organic photoactive material layer 627; and (2) the heterojunction formed between the PW-CNT containing first donor material layer 625 and the $C_{60}$ in the layers 627 and 630. The additional organic photoactive material layer 627 is formed by co-depositing the near-IR absorbing SnPc and $C_{60}$ (1:3 by volume, 10 nm thick) over the PW-CNT containing layer 625. In this example, the PW-CNTs are wrapped with thiophene based polymers such as P3HT rather than MDMO-PPV. The ratio of P3HT to CNTs is 3.2 mg/ml of P3HT to 1 mg/ml of CNTs. FIG. 21B shows the extinction coefficients for the various materials used in our devices. The solid line 700 is that of a PW-CNT solution, the dashed line 710 is SnPc, the dash-dot line 720 is $C_{60}$, the dash-dot-dot line 730 is P3HT, and the dotted line 740 is MDMO-PPV.

Figure 21C:
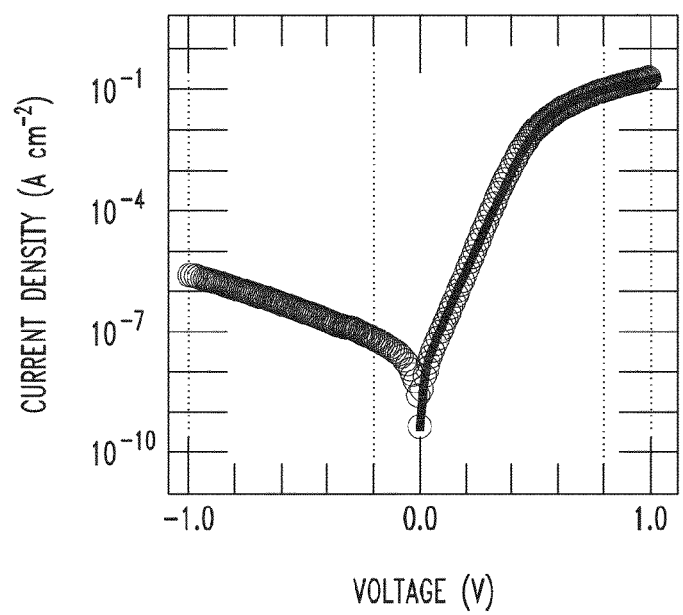
FIG. 21C is a current-voltage plot for the device of FIG. 21A.

FIG. 21C shows a current-voltage plot for the device 600 of FIG. 21A. The dark current of $10^{-6}$ $A/cm^2$ of the P3HT-based device is approximately two orders of magnitude lower than for that based on MDMO-PPV, possibly due to the approximately 50% reduction in PW-CNT concentration in the former structure. Furthermore, a fit to the data gives a relatively high specific series resistance 2.45 $\Omega$-$cm^2$ and an ideality factor of 1.34, which indicate that percolating shunt current paths prevalent in devices with very high CNT concentrations have been substantially reduced in the photoactive device 600.

Figure 21D:
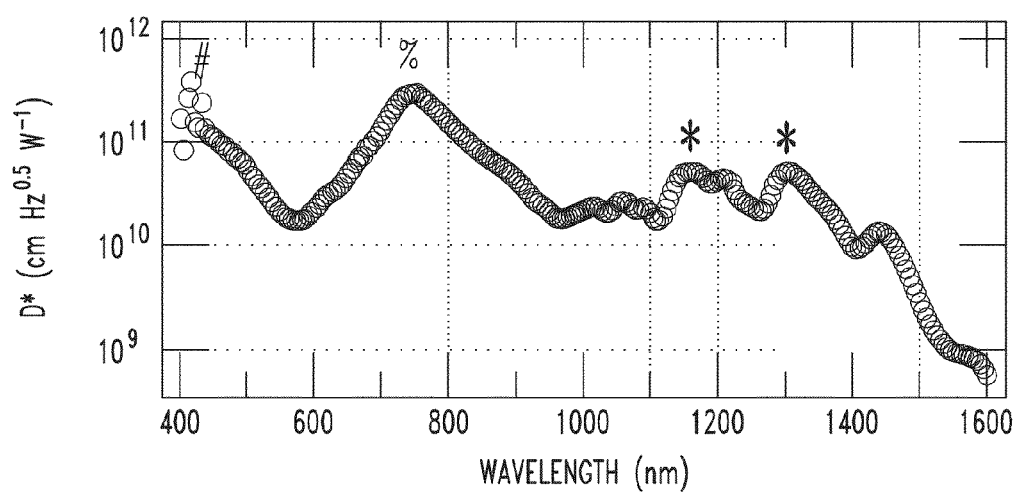
FIG. 21D is a plot of the specific detectivity of the device of FIG. 21A.

Based on these dark current characteristics, the specific detectivity (D*) of the photoactive region 620 formed of PW-CNT:P3HT/$C_{60}$+SnPc at 0 V was calculated by assuming the diode noise is primarily thermal in origin. FIG. 21D shows the specific detectivity (D*) of the device in FIG. 19A with the PW-CNT layer comprising a 0.32% wrapping polymer (P3HT), 0.1% HiPCO CNTs, sonicated and centrifuged for 5 hrs at 14000 g. The sample was fabricated on annealed ITO, with a 10 nm layer of co-deposited SnPc+$C_{60}$ layer 627 in a 1:3 ratio and the $C_{60}$ thickness is 100 nm. The photoactive device 600 exhibits D*>$10^{10}$ cm $Hz^{1/2}$ $W^{-1}$ from $\lambda$<400 nm to $\lambda$=1450 nm. The response in the ranges of: $\lambda$<600 nm, $\lambda$=600 nm-950 nm, and $\lambda$>950 nm is predominantly due to the presence of $C_{60}$ and P3HT, the SnPc, and the PW-CNTs, respectively. The responsivity significantly decreases at $\lambda$>1450 nm due to of a lack of absorption corresponding to the high end of the CNT diameter range at ~1.1 nm.

The inventors are not aware of organic photoactive devices with D* extending beyond λ=1000 nm, and with appreciable responsivity at λ>1200 nm.

Figure 20:
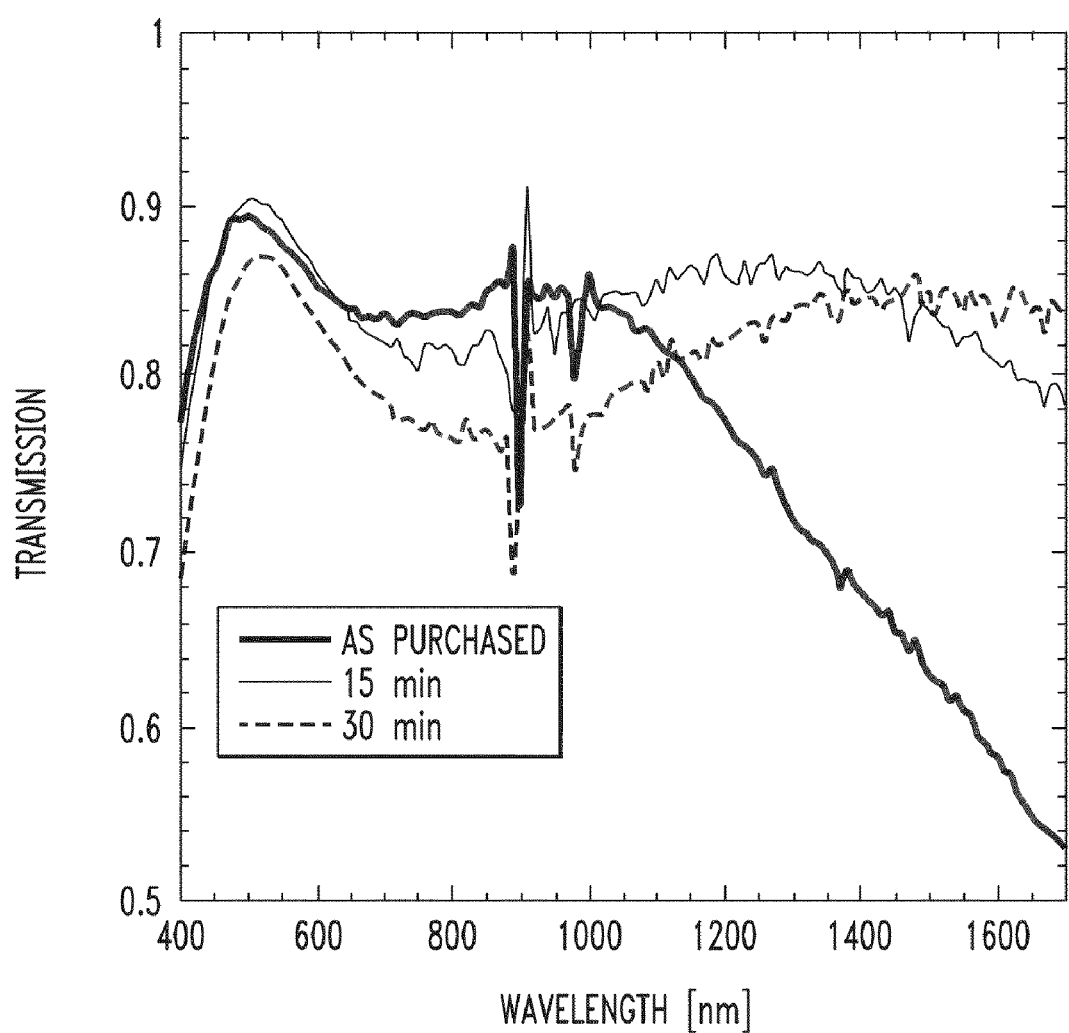
FIG. 20 is a plot of absorption of commercial ITO as received, after a 15 minute, and 30 minute anneal in air at about 300° C.

Lastly, an appropriate ITO material is desired. Commercial ITO typically has increasing absorption above wavelengths of 1000 nm as it is optimized for use at visible wavelengths. This is not desirable in the near-IR photoactive devices of the present disclosure because the CNT containing layer must have a large optical field to maximize the absorption and because the ITO is directly next to the CNT containing layer, it is difficult to tailor the optical field so that the optical field is low in the ITO yet large in the adjacent CNT containing layer. The inventors have found that the absorption above 1000 nm wavelength can be reduced by annealing the ITO in air to decrease the carrier concentration which increases the wavelength of the plasmon responsible for the ITO absorption. By annealing the ITO in air at about 250-400° C., preferably at about 300° C. for as little as 10 minutes and up to 30 minutes, the absorption profile can be modified so that it is optimized for near-IR response as seen in FIG. 20. The absorption is due to a plasmon absorption and is thus the energy of the absorption is related to the square root of carrier concentration. A mild anneal in air reduces the ITO carrier concentration and increases the wavelength of the plasmon resonance. FIG. 20 shows absorption of commercial ITO as received, after a 15 minute, and 30 minute anneal in air at 300° C.

In other embodiments, other transparent electrode material such as transparent polymer electrode material can be used for the anode of the photoactive devices. Some examples of transparent conducting polymers that can be used as hole-injecting anodes in the photoactive devices are polyaniline (PAni) and polyethylenedioxythiophene (PEDT). These polymers can be used doped with a suitable conducting polymer such as polystyrenesulfonic acid (PSS), for example.

In conclusion, we have demonstrated photoactive devices employing a heterogeneous material system consisting of PW-CNT based along with the vacuum thermal evaporation deposited molecules, SnPc and $C_{60}$. The resulting photoactive devices have responses extending to λ=1450 nm with a peak EQE=2.3% at λ=1155 nm. It is expected that the extension of the spectral responsivity to near λ=2000 nm can be achieved by employing larger diameter carbon nanotubes with their smaller optical band gaps. The combination of carbon nanotubes, organic polymers, and small molecular weight organic semiconductors offers the potential for realizing a family of semiconductor devices useful in an unprecedented range of optoelectronic applications. In particular, semiconducting CNTs, with their broad spectral absorbance, chemical stability in ambient environments, and excellent charge transport characteristics have potential for use in solution-processable, high-efficiency photoactive devices such as photovoltaic cells and photodetectors. Indeed, the very broad spectral coverage that results from the diametrically polydisperse film of nanotubes is a significant departure from the relatively narrow excitonic absorption lines of conventional organic photovoltaic devices that has led to their characteristically low power conversion efficiencies.

In the photoactive devices employing a heterogeneous material system consisting of PW-CNTs along with the vacuum deposited small molecule materials, such as SnPc and $C_{60}$, the PW-CNTs are preferably substantially semiconducting PW-CNTs and more preferably the CNTs therein are SWNTs.

The photoactive device embodiments described herein incorporating a second donor material layer, such as the SnPc containing layer, in the photoactive region, the electron and exciton blocking layers and improved ITO electrode have an increased broadband photo responsivity over the spectrum of 400-1450 nm with the photo responsivity improvement between the range λ=600 and 950 nm provided by the utilization of SnPc.

While the present invention is described with respect to particular examples and preferred embodiments, it is understood that the present invention is not limited to these examples and embodiments. The present invention as claimed therefore includes variations from the particular examples and preferred embodiments described herein, as will be apparent to one of skill in the art.

What is claimed is:

1. A device comprising:
    a first electrode;
    a second electrode;
    a photoactive region disposed between and electrically connected to the first electrode and the second electrode, the photoactive region comprising:
        a first organic photoactive layer comprising a first donor material formed above the first electrode, wherein the first donor material comprises photoactive substantially semiconducting polymer-wrapped carbon nanotubes, wherein the carbon nanotubes themselves generate excitons by absorbing photons;
        a second organic photoactive layer comprising a first acceptor material formed above the first organic photoactive material layer; and
        one or more additional organic photoactive materials disposed between the first and second organic photoactive material layers, wherein the additional organic photoactive material layers comprise a discontinuous layer having a plurality of islands and serving as a donor relative to the first acceptor material or as an acceptor relative to the first donor material.

2. The device of claim 1, wherein a portion of the one or more additional organic photoactive material layers comprise a unitary layer having a plurality of openings there through and the first organic photoactive layer is in direct contact with the second organic photoactive layer through the openings.

3. The device of claim 1, wherein the first organic photoactive material layer is in direct contact with the second organic photoactive material layer in-between the islands.

4. The device of claim 1, wherein the one or more additional organic photoactive material layers comprises a small molecule material.

5. The device of claim 4, wherein the small molecule material has an absorption coefficient of at least $5\times10^4$ cm$^{-1}$ across a wavelength band from 600 nm to 900 nm.

6. The device of claim 5, wherein a HOMO of the small molecule material is no more than 0.16 eV above a HOMO of the first donor material.

7. The device of claim 5, wherein a band gap of the small molecule material is less than a band gap of the first donor material.

8. The device of claim 5, wherein the small molecule material has a hole mobility of less than $1\times10^{-9}$ cm$^2$/Vs and an absorption coefficient of at least $5\times10^4$ cm$^{-1}$ across a wavelength band from 600 nm to 900 nm.

9. The device of claim 8, wherein the small molecule material comprises a material selected from tin (II) phthalocyanine (SnPc) and lead phthalocyanine (PbPc).

10. The device of claim 4, wherein at least one of the one or more organic photoactive material layers comprises a co-deposited layer of the small molecule material and the first acceptor material.

11. The device of claim 1, wherein the first electrode is formed from a transparent polymer electrode material.

12. The device of claim 1, wherein the first electrode is indium tin oxide.

13. The device of claim 12, wherein the indium tin oxide has been annealed in air between 250 to 400° C.

14. The device of claim 12, wherein the indium tin oxide has been annealed in air for about 10-30 minutes at 300° C.

15. The device of claim 1, wherein the acceptor material is $C_{60}$ having a thickness of about 100-140 nm.

16. The device of claim 1, wherein the polymer-wrapped carbon nanotubes are substantially semiconducting polymer-wrapped single-wall carbon nanotubes.

17. The device of claim 16, wherein the polymer-wrapped single-wall carbon nanotubes are wrapped with a photoactive polymer.

18. The device of claim 16, wherein the polymer-wrapped single-wall carbon nanotubes create excitons upon absorption of light in the range of about 400 nm to 1400 nm.

19. The device of claim 1, further comprising an exciton blocking layer provided between the second organic photoactive material layer and the second electrode.

20. The device of claim 1, further comprising an exciton blocking layer provided between the first organic photoactive material layer and the first electrode.

21. The device of claim 1, further comprising an electron blocking layer provided between the first organic photoactive material layer and the first electrode.

22. The device of claim 21, wherein the electron blocking layer is formed from one of $SiO_2$, PFO or NiO.

23. The device of claim 1, wherein the first acceptor material layer is formed from one of $C_{60}$, [84]PCBM ([6,6]-Phenyl $C_{84}$ butyric acid methyl ester), $F_{16}$-CuPc, PTCBI, PTCDA, Poly(benzimidazobenzophenanthroline), TCNQ (7,7,8,8-tetracyanoquinodimethane), and $F_4$-TCNQ (tetrafluorotetracyanoquinodimethane).

24. The device of claim 1, wherein the first organic photoactive material layer is a bulk heterojunction.

* * * * *